(12) United States Patent
Schmaunz et al.

(10) Patent No.: US 11,837,434 B2
(45) Date of Patent: Dec. 5, 2023

(54) SETTING POSITION OF A PARTICLE BEAM DEVICE COMPONENT

(71) Applicant: Carl Zeiss Microscopy GmbH, Jena (DE)

(72) Inventors: Andreas Schmaunz, Oberkochen (DE); Gero Walter, Westhausen (DE); Bernd Stenke, Illertissen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 312 days.

(21) Appl. No.: 16/587,645

(22) Filed: Sep. 30, 2019

(65) Prior Publication Data

US 2020/0144024 A1    May 7, 2020

(30) Foreign Application Priority Data

Oct. 2, 2018 (DE) ........................ 102018216968.3

(51) Int. Cl.
*H01J 37/28* (2006.01)
*H01J 37/10* (2006.01)
*H01J 37/26* (2006.01)

(52) U.S. Cl.
CPC .............. *H01J 37/28* (2013.01); *H01J 37/10* (2013.01); *H01J 37/265* (2013.01); *H01J 2237/20214* (2013.01); *H01J 2237/24585* (2013.01)

(58) Field of Classification Search
CPC .......... H01J 37/28; H01J 37/10; H01J 37/265; H01J 2237/20214; H01J 2237/24585; H01J 37/023; H01J 37/26; H01J 37/244; H01J 37/3244; H01J 2237/202; H01J 2237/245

USPC .......... 250/306, 307, 310, 311, 492.1–492.3
See application file for complete search history.

(56) References Cited

U.S. PATENT DOCUMENTS

| | | | |
|---|---|---|---|
| 4,803,358 A * | 2/1989 | Kato ..................... | H01J 37/20 250/307 |
| 7,378,664 B1 * | 5/2008 | Howard ................ | H01J 37/244 250/311 |
| 2004/0036031 A1 | 2/2004 | Rose et al. | |

(Continued)

FOREIGN PATENT DOCUMENTS

| | | |
|---|---|---|
| DE | 10 2007 054 073 A1 | 5/2009 |
| DE | 10 2009 033 319 A1 | 2/2011 |
| WO | WO 02/067286 A2 | 8/2002 |

*Primary Examiner* — Georgia Y Epps
*Assistant Examiner* — Michael P Maskell
(74) *Attorney, Agent, or Firm* — Muirhead and Saturnelli, LLC

(57) ABSTRACT

A method for setting position of a component of a particle beam apparatus may be performed, for example, by the particle beam apparatus. The component may be embodied as a gas feed device, as a particle detector and/or as a beam detector. The method may include: aligning the component with a coincidence point of a particle beam of the particle beam apparatus, determining a rotation angle of a rotation of an object carrier about a rotation axis, loading a position of the component associated with the rotation angle from a database into a control unit, transmitting a control signal from the control unit to a drive unit for moving the component, and moving the component into the position loaded from the database by means of the drive unit, wherein the component arranged in the loaded position is at a predefinable distance from the object.

18 Claims, 14 Drawing Sheets

(56) References Cited

U.S. PATENT DOCUMENTS

| | | | |
|---|---|---|---|
| 2008/0265158 A1* | 10/2008 | Iwasaki | H01J 37/302 |
| | | | 250/310 |
| 2009/0152459 A1* | 6/2009 | Buhler | G03F 1/74 |
| | | | 250/306 |
| 2011/0079711 A1 | 4/2011 | Buehler et al. | |
| 2016/0118216 A1* | 4/2016 | Doemer | H01J 37/023 |
| | | | 250/307 |

* cited by examiner

SETTING POSITION OF A PARTICLE BEAM DEVICE COMPONENT

CROSS-REFERENCE TO RELATED APPLICATION

This application claims the benefit of German patent application no. 10 2018 216 968.3, filed on Oct. 2, 2018, which application is incorporated herein by reference.

TECHNICAL FIELD

The system described herein relates to particle beam analysis, more particularly to a method for setting a position of at least one component of a particle beam apparatus, and to a particle beam apparatus with which this method is able to be carried out.

BACKGROUND OF THE INVENTION

Electron beam apparatuses, in particular a scanning electron microscope (also referred to as SEM below) and/or a transmission electron microscope (also referred to as TEM below), are used to examine objects (samples) in order to obtain knowledge in respect of the properties and behavior under certain conditions.

In an SEM, an electron beam (also referred to as primary electron beam below) is generated by means of a beam generator and focused onto an object to be examined by way of a beam guiding system. The primary electron beam is guided in a raster manner over a surface of the object to be examined by way of a deflection device. Here, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An imaging of the object to be examined is thus obtained.

In the case of a TEM, a primary electron beam is likewise generated by means of a beam generator and focused onto an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Here, imaging may also take place in the scanning mode of a TEM. As a rule, such a TEM is referred to as STEM. Additionally, provision can be made for detecting electrons backscattered at the object to be examined and/or secondary electrons emitted by the object to be examined by means of a further detector in order to image an object to be examined.

Furthermore, it is known from the prior art to use combination apparatuses for examining objects, wherein both electrons and ions can be guided onto an object to be examined. By way of example, it is known to equip an SEM additionally with an ion beam column. An ion beam generator arranged in the ion beam column generates ions that are used for preparing an object (for example removing material of the object or applying material to the object) or else for imaging. The SEM serves here in particular for observing the preparation, but also for further examination of the prepared or unprepared object.

In a further known particle beam apparatus, applying material to the object is carried out for example using the feed of a gas. The known particle beam apparatus is a combination apparatus that provides both an electron beam and an ion beam. The particle beam apparatus comprises an electron beam column and an ion beam column. The electron beam column provides an electron beam that is focused onto an object. The object is arranged in a sample chamber kept under vacuum. The ion beam column provides an ion beam that is likewise focused onto the object. By way of example, a layer of the surface of the object is removed by means of the ion beam. After said layer has been removed, a further surface of the object is exposed. By means of a gas feed device, a gaseous precursor substance—a so-called precursor—can be admitted into the sample chamber. It is known to embody the gas feed device with an acicular device, which can be arranged very close to a position of the object at a distance of a few µm, such that the gaseous precursor substance can be guided to this position as accurately as possible. As a result of the interaction of the ion beam with the gaseous precursor substance, a layer of a substance is deposited on the surface of the object. By way of example, it is known for a gaseous phenanthrene to be admitted as gaseous precursor substance into the sample chamber by means of the gas feed device. Essentially a layer of carbon or a carbon-containing layer then deposits on the surface of the object. It is also known to use a gaseous precursor substance comprising metal in order to deposit a metal on the surface of the object. However, the depositions are not limited to carbon and/or metals. Rather, arbitrary substances can be deposited on the surface of the object, for example semiconductors, non-conductors or other compounds. Furthermore, it is moreover known for the gaseous precursor substance to be used for removing material of the object upon interaction with a particle beam.

In order that the acicular device does not disturb further processes for imaging, analyzing and/or processing the object in the particle beam apparatus, it is known to move the acicular device from a processing position into a parked position. In the processing position of the acicular device, the gaseous precursor substance is guided to the object. In the parked position, by contrast, no gaseous precursor substance is guided to the object. The acicular device is arranged in the parked position in such a way that the acicular device does not influence further processes for imaging, analyzing and/or processing the object by means of the particle beam apparatus. If it is again desired to feed the gaseous precursor substance to the object, the acicular device is moved into the processing position again. As soon as the acicular device is in the processing position again, the gaseous precursor substance is guided to the object.

The settings of the movement of the acicular device from the parked position into the processing position, and vice versa, that are known from the prior art are very complex. In the prior art, provision is made, for example, for firstly moving the acicular device from the parked position over a distance of a few centimeters to a position by means of a compressed air actuator, wherein said position is situated in the vicinity of the processing position. From said position, the acicular device is then moved into the processing position with a drive unit manually and with observation of an imaging of the acicular device and of the object, said imaging being provided by the particle beam apparatus. On account of the manual setting, this is a very slow and inaccurate method since this type of setting of the processing position is beset by large errors.

In order that enough carbon or metal can be deposited on the surface or that material is removed from the surface of the object, it is desirable to arrange the acicular device of the gas feed device as close as possible to the position on the surface of the object at which for example a layer is intended to be deposited or removed. It is accordingly desirable to position the acicular device as close as possible to the object and to align it with the desired position of the surface of the object.

During a process in the particle beam apparatus wherein both the gaseous precursor substance and an imaging or processing of the object by means of a particle beam are desired, it is important to arrange the acicular device in a position in which both the gaseous precursor substance is guided sufficiently to the object and the acicular device does not influence the operation of the particle beam apparatus. In particular, it is desirable for the acicular device not to block the particle beam guided to the object in such a way that the particle beam does not reach the object.

SUMMARY OF THE INVENTION

Therefore, the problem addressed by the system described herein is that of specifying a method and a particle beam apparatus with which a component of a particle beam apparatus, in particular a gas feed device, is positionable at a specific position as accurately as possible and very rapidly, without influencing the particle beam of the particle beam apparatus.

According to an embodiment of the system described herein a method is provided for setting a position of a component in a particle beam apparatus, wherein the particle beam apparatus has an object arranged on an object carrier embodied in a movable fashion. The object may be for example imaged, analyzed and/or processed by the particle beam apparatus. The component may be embodied as a gas feed device, as a particle detector, as a beam detector, as a manipulator for processing the object, as a holding device for holding the object, as a device for removing at least one part of the object from the object, as a light beam source and/or as a particle beam source. However, the above enumeration is not exhaustive. Rather, any component of the particle beam apparatus whose position is settable with respect to the object in the particle beam apparatus may be used in the system described herein.

The method according to an embodiment of the system described herein comprises aligning the component with a coincidence point of a particle beam of the particle beam apparatus. By way of example, the particle beam may be provided by means of a beam generator of the particle beam apparatus. The particle beam has charged particles. By way of example, the charged particles are electrons or ions. The coincidence point is the point on the surface of the object at which the particle beam impinges on the object. If the particle beam apparatus provides at least two particle beams, then the coincidence point is for example the point at which both a first particle beam and a second particle beam impinge on the object.

The method according to an embodiment of the system described herein also comprises determining a rotation angle of a rotation of the object carrier about a rotation axis. By way of example, the aforementioned rotation is a tilting about a tilt axis. Determining the rotation angle may be carried out for example by reading off the rotation angle on a display unit that receives a measurement signal from a rotation angle sensor of the object carrier. The rotation angle of the rotation of the object carrier about the rotation axis may be measured by means of the rotation angle sensor.

Furthermore, a further step of the method according to an embodiment of the system described herein may involve loading a position of the component associated with the rotation angle from a database into a control unit. To put it another way, that position of the component which the component is intended to assume when the object carrier has rotated about the rotation axis with the rotation angle determined may be loaded from the database. The control unit may be, for example, a control unit of the component and/or of the particle beam apparatus. Furthermore, the database may be, for example, a database of the component and/or of the particle beam apparatus.

Furthermore, the method according to an embodiment of the system described herein comprises transmitting a control signal from the control unit to a drive unit by which the component is moved. By way of example, the drive unit is embodied as a piezoactuator. However, the system described herein is not restricted to the use of a piezoactuator as drive unit. Rather, any drive unit which is suitable for the system described herein may be used in the system described herein.

The method according to an embodiment of the system described herein also comprises moving the component into the position loaded from the database by means of the drive unit. If the component is arranged in the position loaded from the database, the component may be at a predefinable distance from the object. By way of example, the predefinable distance is given by the length of a straight line between the coincidence point and a first point arranged on the surface of the component, wherein the first point is arranged the closest to the coincidence point. By way of example, said first point is the midpoint of a circular embodiment of the component, in particular a circular opening of an acicular device of a gas feed device. As an alternative thereto, by way of example, the distance is given by the length of a straight line between the object and the component, wherein the straight line is oriented parallel to an optical axis of the particle beam apparatus or perpendicular to a surface normal of the object and connects a second point on the surface of the object to a third point on the component, wherein the third point is arranged closest to the second point on the surface of the object.

The method according to an embodiment of the system described herein has the advantage that the component in the particle beam apparatus always assumes the position in which the component is at a suitable distance from the object. By way of example, this is the smallest possible distance from the object. The smallest possible distance is, for example, the distance with which the component achieves a sufficiently or even particularly good technical effect and with which the component does not disturb further processes carried out by the particle beam apparatus. If the component is embodied as a gas feed device, for example, positioning the component at the predefinable distance from the object ensures, for example, that, on the one hand, enough gas—for example a gaseous precursor substance—is fed to the object and, on the other hand, the gas feed device does not block a particle beam of the particle beam apparatus in such a way that the particle beam is not guided onto the object. In particular, in the case of an embodiment of the component as a gas feed device, it is possible to achieve a sufficiently good deposition of material on a surface of the object or a sufficiently good removal of material on the surface of the object. If the component is embodied as a particle detector, for example, the particle detector, for example, is always spaced apart from the object in such a way that a particularly good detection of particles is achievable. Furthermore, the method according to an embodiment of the system described herein provides a possibility of arranging the component in an automated manner in the position in which it is at the predefinable distance. Furthermore, the method according to an embodiment of the system described herein ensures that the component may be brought very rapidly from a parked position, which is at a distance of a few centimeters from the object, into a processing position, in which the component is at the predefinable distance from the object.

In one embodiment of the method of the system described herein, provision is made, additionally or alternatively, for the predefinable distance to be predefined by a setpoint distance. The setpoint distance is the intended distance for example at least between the component and the object or the object carrier. By way of example, the setpoint distance is in a range of 100 µm to 500 µm or in a range of 200 µm to 300 µm. By way of example, the setpoint distance is 250 µm. In this embodiment of the method of the system described herein, provision is made, for example, for loading the position of the component associated with the rotation angle from the database to be carried out depending on the setpoint distance mentioned above.

In a further embodiment of the method of the system described herein, provision is made, additionally or alternatively, for the position of the component associated with the rotation angle to be determined and to be stored in the database for the purpose of loading from the database into the control unit. By way of example, provision is made for the position of the component associated with the rotation angle to be determined and to be stored in the database as follows.

The object carrier may be firstly rotated about the rotation axis with a freely selectable and settable rotation angle. By way of example, the rotation angle is in a range of between 0° and 90° with respect to the optical axis of the particle beam apparatus, the range limits being concomitantly included here. Determining an actual distance between the component and the object is then carried out. By way of example, the actual distance is ascertained by an imaging of the object and of the component being generated by the particle beam apparatus and the imaging created being used for determining the actual distance. In addition or as an alternative thereto, provision is made for ascertaining the actual distance for example by means of a light-optical microscope arranged at the particle beam apparatus.

In addition or as an alternative thereto in turn, provision is made for determining the actual distance as follows. The component is moved from a first starting position, in which the component is situated, relatively in the direction of the object, which is situated in a second starting position, until the component touches the object. Accordingly, the component and/or the object may be moved until the component touches the object. When the component touches the object an adjustment distance covered by the component and/or the object during movement may be determined, wherein the adjustment distance extends along a straight line connecting a first point on the component in the first starting position to a second point on the object in the second starting position, said second point being arranged closest to the first point on the component along said straight line, wherein the adjustment distance corresponds to the actual distance.

When the actual distance between the component and the object has been determined, in the further embodiment of the method of the system described herein, it is additionally or alternatively provided that, if the actual distance does not correspond to the predefinable distance, the component is moved into a position by means of the drive unit in such a way that the component is at the predefinable distance from the object. Furthermore, this position of the component depending on the rotation angle may be stored in the database. Furthermore, by way of example, a parameter set of the drive unit associated with this position of the component is stored in the database. If the parameter set is used for the operation of the drive unit, then the component may be moved by means of the drive unit into this position in which the component is at the predefinable distance from the object.

The abovementioned method steps for determining the position of the component depending on the rotation angle, storing this position depending on the rotation angle in the database and/or storing the parameter set for operating the drive unit in the database, may be carried out for example at the factory during the manufacture of the particle beam apparatus.

The system described herein also relates to a further method for setting a position of a component in a particle beam apparatus. The particle beam apparatus may have an object arranged on an object carrier embodied in a movable fashion. The object is for example imaged, analyzed and/or processed by the particle beam apparatus. The component may be embodied as a gas feed device, as a particle detector, as a beam detector, as a manipulator for processing the object, as a holding device for holding the object, as a device for removing at least one part of the object from the object, as a light beam source and/or as a particle beam source. However, the above enumeration is not exhaustive. Rather, any component of the particle beam apparatus whose position is settable with respect to the object in the particle beam apparatus may be used in the system described herein.

The further method according to an embodiment of the system described herein comprises aligning the component with a coincidence point of a particle beam of the particle beam apparatus. By way of example, the particle beam is provided by means of a beam generator of the particle beam apparatus. The particle beam has charged particles. By way of example, the charged particles are electrons or ions. The coincidence point is the point on the surface of the object at which the particle beam impinges on the object. If the particle beam apparatus provides at least two particle beams, then the coincidence point is, for example, the point at which both a first particle beam and a second particle beam impinge on the object.

The further method according to an embodiment of the system described herein also comprises determining a temperature of the component by means of a temperature measuring unit. By way of example, an infrared measuring apparatus or a semiconductor temperature sensor is used as temperature measuring unit. However, the system described herein is not restricted to the use of such temperature measuring units. Rather, any suitable temperature measuring unit which is suitable for the system described herein may be used as temperature measuring unit.

Furthermore, a further step of the further method according to an embodiment of the system described herein may involve loading a position of the component associated with the temperature of the component from a database into a control unit. To put it another way, that position of the component which the component is intended to assume when the component has the measured temperature is loaded from the database. The control unit is, for example, a control unit of the component and/or of the particle beam apparatus.

Furthermore, the database is, for example, a database of the component and/or of the particle beam apparatus.

Furthermore, the further method according to an embodiment of the system described herein comprises transmitting a control signal from the control unit to a drive unit by which the component is moved. By way of example, the drive unit is embodied as a piezoactuator. However, the system described herein is not restricted to the use of a piezoactuator as drive unit. Rather, any drive unit which is suitable for the system described herein may be used in the system described herein.

The further method according to an embodiment of the system described herein also comprises moving the component into the position loaded from the database by means of the drive unit. If the component is arranged in the position loaded from the database, the component is at a predefinable distance from the object. Here, too, by way of example, the predefinable distance is given by the length of a straight line between the coincidence point and a first point arranged on the surface of the component, wherein the first point is arranged the closest to the coincidence point. By way of example, said first point is the mid-point of a circular embodiment of the component, in particular a circular opening of an acicular device of a gas feed device. As an alternative thereto, by way of example, the distance is given by the length of a straight line between the object and the component, wherein the straight line is oriented parallel to an optical axis of the particle beam apparatus or perpendicular to a surface normal of the object and connects a second point on the surface of the object to a third point on the component, wherein the third point is arranged closest to the second point on the surface of the object.

The further method according to an embodiment of the system described herein also has the advantage that the component in the particle beam apparatus always assumes the position in which the component is at a suitable distance from the object. By way of example, this is the smallest possible distance from the object. The smallest possible distance is, for example, the distance with which the component achieves a sufficiently or even particularly good technical effect and with which the component does not disturb further processes carried out by the particle beam apparatus. On account of the determination of the temperature of the component, a change in a length extent of the component, which is dependent on the temperature of the component, may be taken into account in the setting of the position of the component in such a way that the component is always at the predefinable distance from the object. If the component is embodied as a gas feed device, for example, positioning the component at the predefinable distance ensures, for example, that, on the one hand, enough gas—for example a gaseous precursor substance—is fed to the object and, on the other hand, the gas feed device does not block a particle beam of the particle beam apparatus in such a way that the particle beam is not guided onto the object. In particular, in the case of an embodiment of the component as a gas feed device, it is possible to achieve a sufficiently good deposition of material on a surface of the object or a sufficiently good removal of material on the surface of the object. If the component is embodied as a particle detector, for example, the particle detector may be always spaced apart from the object in such a way that a particularly good detection of particles is achievable. Furthermore, the further method according to an embodiment of the system described herein provides a possibility of arranging the component in an automated manner in the position in which it is at the predefinable distance. Furthermore, the method according to an embodiment of the system described herein ensures that the component may be brought very rapidly from a parked position, which is at a distance of a few centimeters from the object, into a processing position, in which the component is at the predefinable distance from the object.

In one embodiment of the further method of the system described herein, provision is made, additionally or alternatively, for the predefinable distance to be predefined by a setpoint distance. The setpoint distance is the intended distance for example at least between the component and the object or the object carrier. By way of example, the setpoint distance is in a range of 100 μm to 500 μm or in a range of 200 μm to 300 μm. By way of example, the setpoint distance is 250 μm. In this embodiment of the further method of the system described herein, provision is made, for example, for loading the position of the component associated with the temperature of the component from the database to be carried out depending on the setpoint distance mentioned above.

In a further embodiment of the further method according to an embodiment of the system described herein, provision is made, additionally or alternatively, for the position of the component associated with the temperature of the component to be determined and to be stored in the database for the purpose of loading from the database into the control unit.

By way of example, provision is made for the position of the component associated with the temperature of the component to be determined and to be stored in the database as follows.

Firstly, as described above, the temperature of the component may be determined. Determining an actual distance between the component and the object then may be carried out. By way of example, the actual distance is ascertained by an imaging of the object and of the component being generated by the particle beam apparatus and the imaging created being used for determining the actual distance. In addition or as an alternative thereto, provision is made for ascertaining the actual distance for example by means of a light-optical microscope arranged at the particle beam apparatus.

In addition or as an alternative thereto in turn, provision is made for determining the actual distance as follows. The component is moved from a first starting position, in which the component is situated, relatively in the direction of the object, which is situated in a second starting position, until the component touches the object. Accordingly, the component and/or the object may be moved. When the component touches the object an adjustment distance covered by the component and/or the object during movement may be determined, wherein the adjustment distance extends along a straight line connecting a first point on the component in the first starting position to a second point on the object in the second starting position, said second point being arranged closest to the first point on the component along said straight line, wherein the adjustment distance corresponds to the actual distance.

In the further embodiment of the further method of the system described herein, it is additionally or alternatively provided that, if the actual distance does not correspond to the predefinable distance, the component is moved into a position by means of the drive unit in such a way that the component is at the predefinable distance from the object. Furthermore, this position of the component depending on the temperature of the component may be stored in the database. Furthermore, by way of example, a parameter set of the drive unit associated with this position of the component is stored in the database. If the parameter set is used for the operation of the drive unit, then the component is moved by means of the drive unit into this position in which the component is at the predefinable distance from the object.

The abovementioned method steps for determining the position of the component depending on the temperature of the component, storing this position depending on the temperature of the component in the database and/or storing the parameter set for operating the drive unit in the database, may be carried out for example at the factory during the manufacture of the particle beam apparatus.

As already mentioned above, in one embodiment of the methods mentioned above, provision is made, additionally or alternatively, for the component and/or the object to be moved along a straight line connecting the coincidence point to a point arranged on the surface of the component, wherein the point is arranged closest to the coincidence point.

In a further embodiment of the methods mentioned above, provision is made, additionally or alternatively, for the component to be moved into the position loaded from the database in two steps. In a first step, the component is moved from a first starting position into a second starting position by means of the drive unit, wherein the first starting position is further away from the coincidence point than the second starting position. Furthermore, in a second step, the component is moved from the second starting position into the position loaded from the database by means of the drive unit. In this embodiment of the methods of the system described herein, provision is made, for example, for moving the component from the first starting position into the second starting position in large steps, wherein a first adjustment distance between the first starting position and the second starting position in the centimeter range, for example, is covered. In particular, the first adjustment distance is in the range of 2 cm to 20 cm or 5 cm to 10 cm. The component may be moved from the second starting position into the position loaded from the database, wherein a second adjustment distance may be covered, which may be in the range of 50 µm to 300 µm or in the range of 100 µm to 200 µm.

In an embodiment of the system described herein, a computer program product is provided comprising a program code which is loadable or loaded into a processor and which, when executed, controls a particle beam apparatus and/or a component of the particle beam apparatus in such a way that a method having at least one of the features mentioned above or mentioned further below or having a combination with at least two of the features mentioned above or further below is carried out.

In a further embodiment of the system described herein, a particle beam apparatus is provided for imaging, analyzing and/or processing an object, comprising at least one beam generator for generating a particle beam with charged particles. By way of example, the charged particles are electrons or ions. The particle beam apparatus may be provided with an optical axis, for example, along which the particle beam may be guidable, and may be guided. Furthermore, the particle beam apparatus may be provided with at least one objective lens for focusing the particle beam onto the object. Furthermore, the particle beam apparatus may comprise at least one object carrier for arranging the object and at least one sample chamber in which a component of the particle beam apparatus may be arranged.

The component of the particle beam apparatus is embodied for example as a gas feed device, as a particle detector, as a beam detector, as a manipulator for processing the object, as a holding device for holding the object, as a device for removing at least one part of the object from the object, as a light beam source and/or as a particle beam source. The object carrier and/or the component may be embodied in an adjustable fashion. The particle beam apparatus may comprise at least one processor in which a computer program product mentioned above is loaded.

In one embodiment of the particle beam apparatus of the system described herein, provision is made, additionally or alternatively, for the object carrier to be embodied as movable along at least one of the following axes, namely a first axis, a second axis and a third axis. By way of example, at least two of the axes mentioned above are oriented perpendicular to one another. In particular, provision may be made for all of the axes to be oriented perpendicular to one another.

In an in turn further embodiment of the particle beam apparatus of the system described herein, provision is made, additionally or alternatively, for the object carrier to be embodied as rotatable about a first rotation axis and/or about a second rotation axis.

In an in turn further embodiment of the particle beam apparatus of the system described herein, provision is made, additionally or alternatively, for the component to be embodied as movable at least along one of the following axes, namely a first component axis, a second component axis and a third component axis. In particular, provision may be made for at least two of the axes mentioned above to be oriented perpendicular to one another. Furthermore, provision may be made, in particular, for all of the component axes to be oriented in each case perpendicular to one another.

In a further embodiment of the particle apparatus of the system described herein, provision is made, additionally or alternatively, for the component to be embodied as rotatable about a first component rotation axis and/or about a second component rotation axis.

In an in turn further embodiment of the particle beam apparatus according to an embodiment of the system described herein, provision is made, additionally or alternatively, for the beam generator to be embodied as a first beam generator, wherein the particle beam may be embodied as a first particle beam with first charged particles, and wherein the objective lens may be embodied as a first objective lens for focusing the first particle beam onto the object. Furthermore, the particle beam apparatus may comprise at least one second beam generator for generating a second particle beam with second charged particles, and at least one second objective lens for focusing the second particle beam onto the object.

In a further embodiment of the particle beam apparatus according to an embodiment of the system described herein, provision is made for the particle beam apparatus to be an electron beam apparatus and/or an ion beam apparatus.

BRIEF DESCRIPTION OF THE DRAWINGS

Further practical embodiments and advantages of the system described herein are described below in association with the drawings. In the figures.

DESCRIPTION OF VARIOUS EMBODIMENTS

Illustrative embodiments of the system described herein will now be described in relation to the drawings. It should be appreciated that the system described herein is not limited to the following illustrative embodiments, as other embodiments, for example, variations of the following illustrative embodiments, are possible, and intended to fall within the scope of the invention.

The system described herein is now explained in more detail by means of particle beam apparatuses in the form of an SEM and in the form of a combination apparatus, which has an electron beam column and an ion beam column. Reference is explicitly made to the fact that the system described herein may be used in any particle beam apparatus, in particular in any electron beam apparatus and/or in any ion beam apparatus. Furthermore, the system described herein is described with respect to a gas feed device. It is expressly pointed out that any component of a particle beam apparatus may be suitable for the system described herein. The component may be embodied in particular as a particle detector, as a beam detector, as a manipulator for processing an object, as a holding device for holding the object, as a device for removing at least one part of the object from the object, as a light beam source and/or as a particle beam source.

Figure 1:
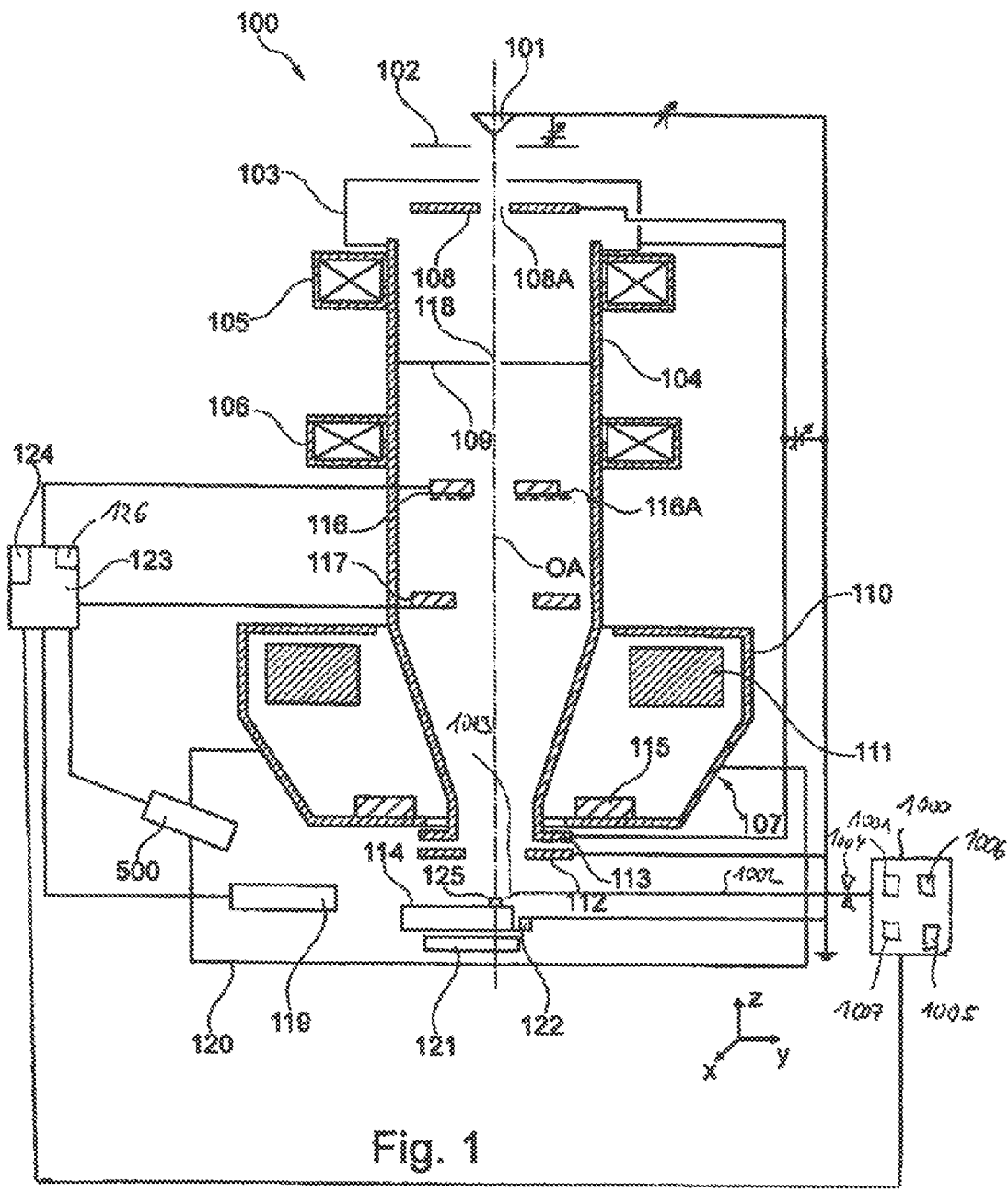
FIG. 1 shows a first embodiment of a particle beam apparatus.

FIG. 1 shows a schematic illustration of an SEM 100. The SEM 100 may comprise a first beam generator in the form of an electron source 101, which may be embodied as a cathode. Further, the SEM 100 may be provided with an extraction electrode 102 and with an anode 103, which may be placed onto one end of a beam guiding tube 104 of the SEM 100. By way of example, the electron source 101 is embodied as a thermal field emitter. However, the system described herein is not restricted to such an electron source 101. Rather, any electron source is utilizable.

Electrons emerging from the electron source 101 form a primary electron beam. The electrons may be accelerated to the anode potential on account of a potential difference between the electron source 101 and the anode 103. In the embodiment illustrated here, the anode potential may be 100 V to 35 kV, e.g., 5 kV to 15 kV, in particular 8 kV, relative to a ground potential of a housing of a sample chamber 120. However, alternatively it could be at ground potential.

Two condenser lenses, namely a first condenser lens 105 and a second condenser lens 106, may be arranged at the beam guiding tube 104. Here, proceeding from the electron source 101 as viewed in the direction of a first objective lens 107, the first condenser lens 105 is arranged first, followed by the second condenser lens 106. Reference is explicitly made to the fact that further embodiments of the SEM 100 may have only a single condenser lens. A first aperture unit 108 may be arranged between the anode 103 and the first condenser lens 105. Together with the anode 103 and the beam guiding tube 104, the first aperture unit 108 may be at a high voltage potential, namely the potential of the anode 103, or at ground. The first aperture unit 108 may have numerous first apertures 108A, of which one is illustrated in FIG. 1. Two first apertures 108A are present, for example. Each one of the numerous first apertures 108A may have a different aperture diameter. By means of an adjustment mechanism (not illustrated), it is possible to set a desired first aperture 108A onto an optical axis OA of the SEM 100. Reference is explicitly made to the fact that, in further embodiments, the first aperture unit 108 may be provided with only a single aperture 108A. In this embodiment, an adjustment mechanism may be absent. The first aperture unit 108 is then designed in a stationary fashion. A stationary second aperture unit 109 is arranged between the first condenser lens 105 and the second condenser lens 106. As an alternative thereto, provision is made for the second aperture unit 109 to be embodied in a movable fashion.

The first objective lens 107 may have pole pieces 110, in which a hole is formed. The beam guiding tube 104 may be guided through this hole. A coil 111 may be arranged in the pole pieces 110.

An electrostatic retardation device may be arranged in a lower region of the beam guiding tube 104. It has an individual electrode 112 and a tube electrode 113. The tube electrode 113 is arranged at one end of the beam guiding tube 104, said end facing an object 125 that is arranged on an object holder 114 embodied in a movable fashion.

Together with the beam guiding tube 104, the tube electrode 113 may be at the potential of the anode 103, while the individual electrode 112 and the object 125 may be at a lower potential in relation to the potential of the anode 103. In the present case, this may be the ground potential of the housing of the sample chamber 120. In this manner, the electrons of the primary electron beam may be decelerated to a desired energy which is required for examining the object 125.

The SEM 100 further may comprise a scanning device 115, by means of which the primary electron beam may be deflected and scanned over the object 125. Here, the electrons of the primary electron beam interact with the object 125. As a result of the interaction, interaction particles may be generated, which may be detected. In particular, electrons may be emitted from the surface of the object 125—the so-called secondary electrons—or electrons of the primary electron beam may be backscattered—the so-called backscattered electrons—as interaction particles.

The object 125 and the individual electrode 112 may also be at different potentials and potentials different than ground. It is thereby possible to set the location of the retardation of the primary electron beam in relation to the object 125. By way of example, if the retardation is carried out quite close to the object 125, imaging aberrations become smaller.

A detector arrangement comprising a first detector 116 and a second detector 117 is arranged in the beam guiding tube 104 for detecting the secondary electrons and/or the backscattered electrons. Here, the first detector 116 may be arranged on the source-side along the optical axis OA, while the second detector 117 may be arranged on the object-side along the optical axis OA in the beam guiding tube 104. The first detector 116 and the second detector 117 may be arranged offset from one another in the direction of the optical axis OA of the SEM 100. Both the first detector 116 and the second detector 117 each have a passage opening, through which the primary electron beam may pass. The first detector 116 and the second detector 117 may be approximately at the potential of the anode 103 and of the beam guiding tube 104. The optical axis OA of the SEM 100 extends through the respective passage openings.

The second detector 117 serves principally for detecting secondary electrons. Upon emerging from the object 125, the secondary electrons initially may have a low kinetic energy and arbitrary directions of motion. By means of the strong extraction field emanating from the tube electrode 113, the secondary electrons may be accelerated in the direction of the first objective lens 107. The secondary electrons may enter the first objective lens 107 approximately parallel. The beam diameter of the beam of secondary electrons may remain small in the first objective lens 107 as well. The first objective lens 107 then may have a strong effect on the secondary electrons and generates a comparatively short focus of the secondary electrons with sufficiently steep angles with respect to the optical axis OA, such that the secondary electrons diverge far apart from one another downstream of the focus and may be incident on the second detector 117 on the active area thereof. By contrast, only a small proportion of electrons that are backscattered at the object 125—that is to say backscattered electrons which have a relatively high kinetic energy in comparison with the secondary electrons upon emerging from the object 125— may be detected by the second detector 117. The high kinetic energy and the angles of the backscattered electrons with respect to the optical axis OA upon emerging from the object 125 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with an opposing field grid 116A. The opposing field grid 116A may be arranged at the side of the first detector 116 directed toward the object 125. With respect to the potential of the beam guiding tube 104, the opposing field grid 116A has a negative potential such that only backscattered electrons with a high energy pass through the opposing field grid 116A to the first detector 116. Additionally or alternatively, the second detector 117 has a further opposing field grid, which has an analogous embodiment to the aforementioned opposing field grid 116A of the first detector 116 and which has an analogous function.

Further, the SEM 100 may have in the sample chamber 120 a chamber detector 119, for example an Everhart-Thornley detector or an ion detector which has a detection surface that is coated with metal and blocks light.

The detection signals generated by the first detector 116, the second detector 117 and the chamber detector 119 may be used to generate an image or images of the surface of the object 125.

Reference is explicitly made to the fact that the apertures of the first aperture unit 108 and of the second aperture unit 109, as well as the passage openings of the first detector 116 and of the second detector 117 are illustrated in exaggerated fashion. The passage openings of the first detector 116 and of the second detector 117 may have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 may be configured as a pinhole aperture in the embodiment illustrated here and may be provided with a second aperture 118 for the passage of the primary electron beam, which may have an extent in the range from 5 µm to 500 µm, e.g., 35 µm. As an alternative thereto, provision is made in a further embodiment for the second aperture unit 109 to be provided with a plurality of apertures, which may be displaced mechanically with respect to the primary electron beam or which may be reached by the primary electron beam by the use of electrical and/or magnetic deflection elements. The second aperture unit 109 may be embodied as a pressure stage unit. It separates a first region, in which the electron source 101 may be arranged and in which an ultra-high vacuum ($10^{-7}$ hPa to $10^{-12}$ hPa) prevails, from a second region, which may have a high vacuum ($10^{-3}$ hPa to $10^{-7}$ hPa). The second region may be the intermediate pressure region of the beam guiding tube 104, which leads to the sample chamber 120.

The sample chamber 120 may be under vacuum. For the purposes of generating the vacuum, a pump (not illustrated) may be arranged at the sample chamber 120. In the embodiment illustrated in FIG. 1, the sample chamber 120 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 120 may be vacuum-sealed.

The object holder 114 may be arranged on an object carrier in the form of a sample stage 122. The sample stage 122 may be embodied to be movable in three directions arranged perpendicular to one another, namely in an x-direction (first stage axis), in a y-direction (second stage axis) and in a z-direction (third stage axis). Moreover, the sample stage 122 may be rotated about two rotation axes which may be arranged perpendicular to one another (stage rotation axes). The system described herein is not restricted to the sample stage 122 described above. Rather, the sample stage 122 may have further translation axes and rotation axes along which or about which the sample stage 122 may move. This will be discussed again in greater detail further below.

The SEM 100 further may comprise a third detector 121, which may be arranged in the sample chamber 120. More precisely, the third detector 121 may be arranged downstream of the sample stage 122, viewed from the electron source 101 along the optical axis OA.

The sample stage 122 and thus the object holder 114 may be rotated in such a way that the primary electron beam may radiate through the object 125 arranged on the object holder 114. When the primary electron beam passes through the object 125 to be examined, the electrons of the primary electron beam interact with the material of the object 125 to be examined. The electrons passing through the object 125 to be examined may be detected by the third detector 121.

Arranged at the sample chamber 120 may be a radiation detector 500, which may be used to detect interaction radiation, for example x-ray radiation and/or cathodoluminescence. The radiation detector 500, the first detector 116, the second detector 117 and the chamber detector 119 may be connected to a control unit 123, which has a monitor 124. The third detector 121 may be also connected to the control unit 123. For reasons of clarity, this is not illustrated. The control unit 123 processes detection signals that may be generated by the first detector 116, the second detector 117, the chamber detector 119, the third detector 121 and/or the radiation detector 500 and displays said detection signals in the form of images on the monitor 124.

The control unit 123 furthermore may have a database 126, in which data may be stored and from which data may be read out.

The SEM 100 may comprise a component in the form of a gas feed device 1000, which serves to feed a gas, for example a gaseous precursor substance, to a specific position on the surface of the object 125. The gas feed device 1000 has a gas reservoir 1001. By way of example, phenanthrene is used as a gaseous precursor substance. Essentially a layer of carbon or a carbon-containing layer then deposits on the surface of the object 125. As an alternative thereto, by way of example, a gaseous precursor substance comprising metal may be used in order to deposit a metal on the surface of the object 125. However, the depositions are not limited to carbon and/or metals. Rather, arbitrary substances may be deposited on the surface of the object 125, for example semiconductors, non-conductors or other compounds. Furthermore, provision is also made for a gas to be used for removing material of the object 125 upon interaction with the particle beam.

The gas feed device 1000 may be provided with a feed line 1002. The feed line 1002 may have, in the direction of the object 125, an acicular device in the form of a hollow tube 1003, which may be able to be brought into the vicinity of the surface of the object 125 for example at a distance of 10 µm to 1 mm on the surface of the object 125. The hollow tube 1003 has a feed opening, the diameter of which is for example in the range of 10 µm to 1000 µm, in particular in the range of 400 µm to 600 µm. The feed line 1002 has a valve 1004 in order to regulate the flow rate of the gas into the feed line 1002. To put it another way, when the valve 1004 is opened, gas from the gas reservoir 1001 may be introduced into the feed line 1002 and guided via the hollow tube 1003 to the surface of the object 125. When the valve 1004 is closed, the flow of the gas onto the surface of the object 125 may be stopped.

The gas feed device 1000 may be furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 may be connected to the control unit 123 of the SEM 100.

In further embodiments, the gas reservoir 1001 may not be arranged directly at the gas feed device 1000. Rather, in said further embodiments, provision is made for the gas reservoir 1001 to be arranged for example at a wall of a space in which the SEM 100 is situated.

The gas feed device 1000 may have a temperature measuring unit 1006. By way of example, an infrared measuring apparatus or a semiconductor temperature sensor is used as temperature measuring unit 1006. However, the system described herein is not restricted to the use of such temperature measuring units. Rather, any suitable temperature measuring unit which is suitable for the system described herein may be used as temperature measuring unit. In particular, provision may be made for the temperature measuring unit not to be arranged at the gas feed device 1000 itself, but rather to be arranged for example at a distance from the gas feed device 1000.

Figure 2:
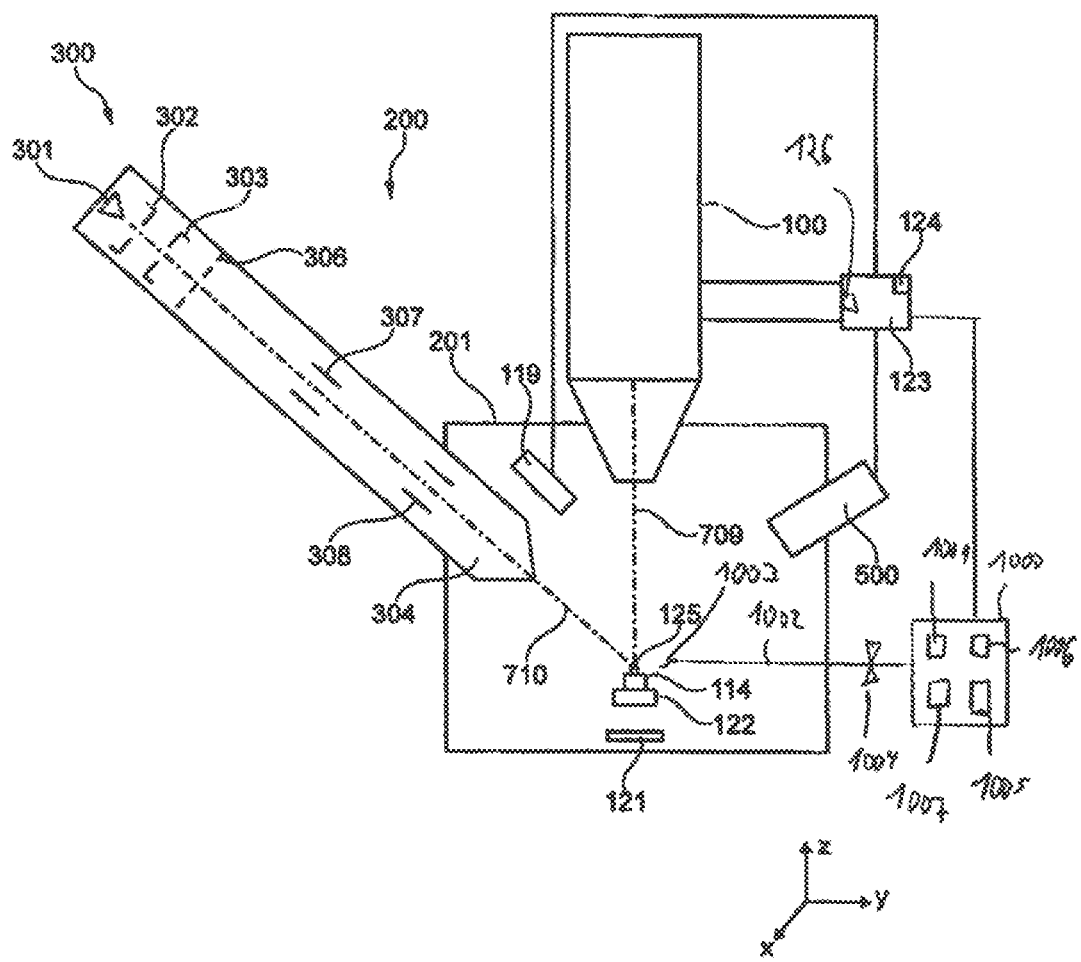
FIG. 2 shows a second embodiment of a particle beam apparatus.

FIG. 2 shows a particle beam apparatus in the form of a combination apparatus 200. The combination apparatus 200 has two particle beam columns. Firstly, the combination apparatus 200 is provided with the SEM 100, as already illustrated in FIG. 1, but without the sample chamber 120. Rather, the SEM 100 is arranged at a sample chamber 201. The sample chamber 201 may be under vacuum. For the purposes of generating the vacuum, a pump (not illustrated) is arranged at the sample chamber 201. In the embodiment illustrated in FIG. 2, the sample chamber 201 is operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 201 may be vacuum-sealed.

Arranged in the sample chamber 201 is the chamber detector 119 which is embodied, for example, in the form of an Everhart-Thornley detector or an ion detector and which has a detection surface coated with metal that blocks light. Further, the third detector 121 may be arranged in the sample chamber 201.

The SEM 100 serves to generate a first particle beam, namely the primary electron beam already described further above, and has the optical axis, already specified above, which is provided with reference sign 709 in FIG. 2 and which is also referred to as first beam axis below. Secondly, the combination apparatus 200 may be provided with an ion beam apparatus 300, which may be likewise arranged at the sample chamber 201. The ion beam apparatus 300 likewise has an optical axis, which may be provided with the reference sign 710 in FIG. 2 and which is also referred to as second beam axis below.

The SEM 100 may be arranged vertically in relation to the sample chamber 201. By contrast, the ion beam apparatus 300 may be arranged in a manner inclined by an angle of approximately 0° to 90° in relation to the SEM 100. An arrangement of approximately 50° is illustrated by example in FIG. 2. The ion beam apparatus 300 may comprise a second beam generator in the form of an ion beam generator 301. Ions, which form a second particle beam in the form of an ion beam, may be generated by the ion beam generator 301. The ions may be accelerated by means of an extraction electrode 302, which may be at a predeterminable potential. The second particle beam then passes through ion optics of the ion beam apparatus 300, wherein the ion optics comprise a condenser lens 303 and a second objective lens 304. The second objective lens 304 ultimately generates an ion probe, which may be focused onto the object 125 arranged at an object holder 114. The object holder 114 may be arranged at a sample stage 122.

A settable or selectable aperture 306, a first electrode arrangement 307 and a second electrode arrangement 308 may be arranged above the second objective lens 304 (i.e. in the direction of the ion beam generator 301), wherein the first electrode arrangement 307 and the second electrode arrangement 308 may be embodied as scanning electrodes. The second particle beam may be scanned over the surface of the object 125 by means of the first electrode arrangement 307 and the second electrode arrangement 308, with the first electrode arrangement 307 acting in a first direction and the second electrode arrangement 308 acting in a second direction, which is counter to the first direction. Thus, scanning may be carried out in, e.g., an x-direction. The scanning in a y-direction perpendicular thereto may be brought about by further electrodes (not illustrated), which may be rotated by 90°, at the first electrode arrangement 307 and at the second electrode arrangement 308.

As explained above, the object holder 114 may be arranged at the sample stage 122. In the embodiment shown in FIG. 2, too, the sample stage 122 is embodied to be movable in three directions arranged perpendicular to one another, namely in an x-direction (first stage axis), in a y-direction (second stage axis) and in a z-direction (third stage axis). Moreover, the sample stage 122 may be rotated about two rotation axes which may be arranged perpendicular to one another (stage rotation axes).

The distances illustrated in FIG. 2 between the individual units of the combination apparatus 200 may be illustrated in exaggerated fashion in order to better illustrate the individual units of the combination apparatus 200.

Arranged at the sample chamber 201 may be a radiation detector 500, which may be used to detect interaction radiation, for example, x-ray radiation and/or cathodoluminescence.

The radiation detector 500 may be connected to a control unit 123, which has a monitor 124. The control unit 123 processes detection signals that are generated by the first detector 116, the second detector 117 (not illustrated in FIG. 2), the chamber detector 119, the third detector 121 and/or the radiation detector 500 and displays said detection signals in the form of images on the monitor 124.

The control unit 123 furthermore may have a database 126, in which data may be stored and from which data may be read out.

The combination apparatus 200 may comprise a component in the form of a gas feed device 1000, which serves to feed a gas, for example, a gaseous precursor substance, to a specific position on the surface of the object 125. The gas feed device 1000 has a gas reservoir 1001. By way of example, phenanthrene is used as a gaseous precursor substance. Essentially a layer of carbon or a carbon-containing layer then deposits on the surface of the object 125. As an alternative thereto, by way of example, a gaseous precursor substance comprising metal may be used in order to deposit a metal on the surface of the object 125. However, the depositions are not limited to carbon and/or metals. Rather, arbitrary substances may be deposited on the surface of the object 125, for example, semiconductors, non-conductors or other compounds. Furthermore, provision is also made for a gas to be used for removing material of the object 125 upon interaction with the particle beam.

The gas feed device 1000 may be provided with a feed line 1002. The feed line 1002 may have, in the direction of the object 125, an acicular device in the form of a hollow tube 1003, which may be able to be brought into the vicinity of the surface of the object 125, for example, at a distance of 10 µm to 1 mm on the surface of the object 125. The hollow tube 1003 has a feed opening, the diameter of which may be, for example, in the range of 10 µm to 1000 µm, in particular in the range of 400 µm to 600 µm. The feed line 1002 has a valve 1004 in order to regulate the flow rate of gas into the feed line 1002. To put it another way, when the valve 1004 is opened, gas from the gas reservoir 1001 may be introduced into the feed line 1002 and guided via the hollow tube 1003 to the surface of the object 125. When the valve 1004 is closed, the flow of the gas onto the surface of the object 125 may be stopped.

The gas feed device 1000 may be furthermore provided with an adjusting unit 1005, which enables an adjustment of the position of the hollow tube 1003 in all three spatial directions—namely an x-direction, a y-direction and a z-direction—and an adjustment of the orientation of the hollow tube 1003 by means of a rotation and/or a tilting. The gas feed device 1000 and thus also the adjusting unit 1005 may be connected to the control unit 123 of the combination apparatus 200.

In further embodiments, the gas reservoir 1001 may not be arranged directly at the gas feed device 1000. Rather, in said further embodiments, provision is made for the gas reservoir 1001 to be arranged, for example, at a wall of a space in which the combination apparatus 200 is situated.

The gas feed device 1000 may have a temperature measuring unit 1006. By way of example, an infrared measuring apparatus or a semiconductor temperature sensor may be used as temperature measuring unit 1006. However, the system described herein is not restricted to the use of such temperature measuring units. Rather, any suitable temperature measuring unit which is suitable for the system described herein may be used as temperature measuring unit. In particular, provision may be made for the temperature measuring unit not to be arranged at the gas feed device 1000 itself, but rather to be arranged, for example, at a distance from the gas feed device 1000.

Figure 3:
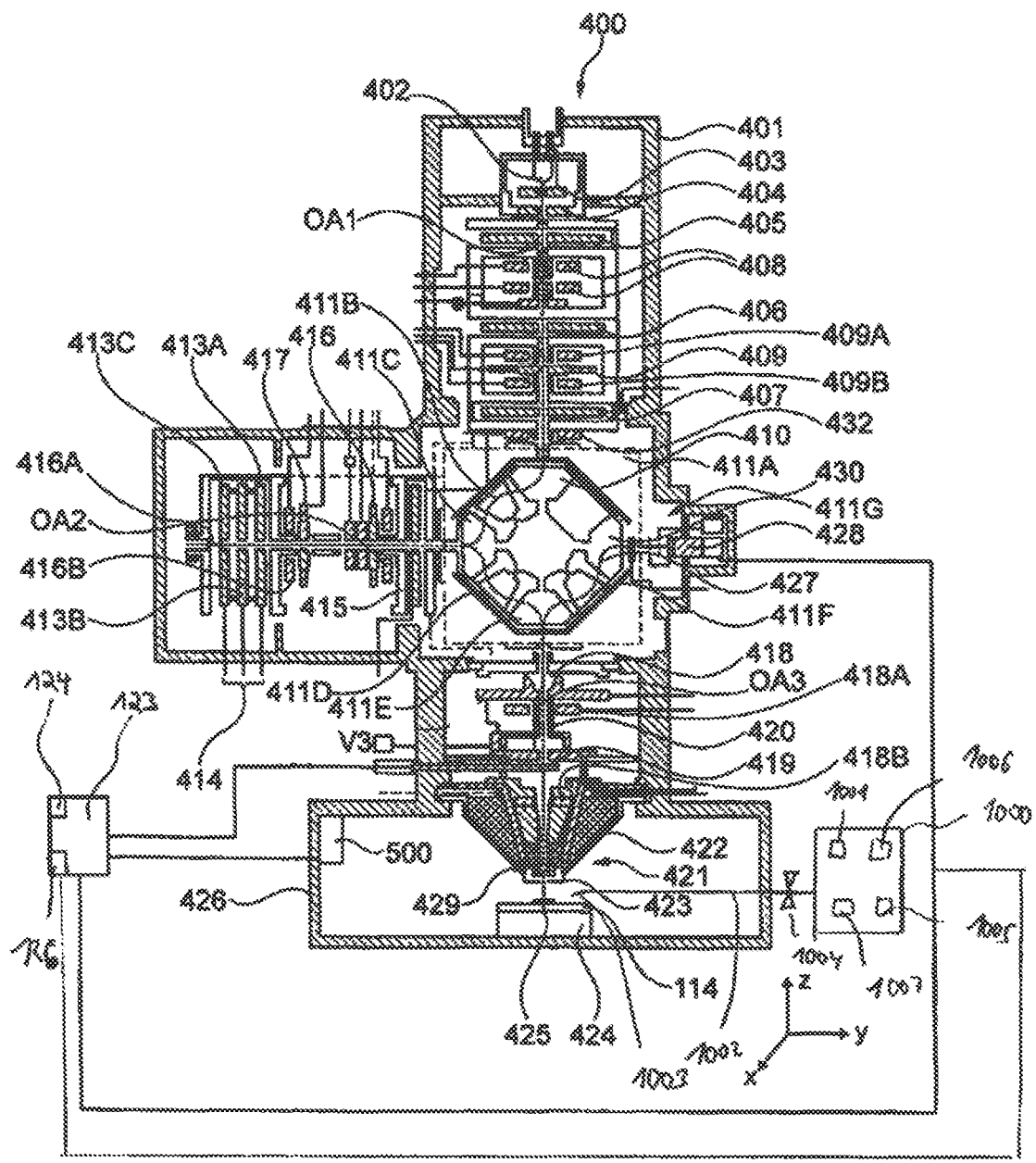
FIG. 3 shows a third embodiment of a particle beam apparatus.

FIG. 3 is a schematic illustration of a further embodiment of a particle beam apparatus according to an embodiment of the system described herein. This embodiment of the particle beam apparatus is provided with the reference sign 400 and comprises a mirror corrector for correcting, e.g., chromatic and/or spherical aberrations. The particle beam apparatus 400 may comprise a particle beam column 401, which may be embodied as an electron beam column and which substantially corresponds to an electron beam column of a corrected SEM. However, the particle beam apparatus 400 is not restricted to an SEM with a mirror corrector. Rather, the particle beam apparatus may comprise any type of corrector units.

The particle beam column 401 may comprise a particle beam generator in the form of an electron source 402 (cathode), an extraction electrode 403, and an anode 404. By way of example, the electron source 402 is embodied as a thermal field emitter. Electrons emerging from the electron source 402 may be accelerated to the anode 404 on account of a potential difference between the electron source 402 and the anode 404. Accordingly, a particle beam in the form of an electron beam may be formed along a first optical axis OA1.

The particle beam may be guided along a beam path, which corresponds to the first optical axis OA1, after the particle beam has emerged from the electron source 402. A first electrostatic lens 405, a second electrostatic lens 406, and a third electrostatic lens 407 may be used to guide the particle beam.

Furthermore, the particle beam may be set along the beam path using a beam guiding device. The beam guiding device of this embodiment comprises a source setting unit with two magnetic deflection units 408 arranged along the first optical axis OA1. Moreover, the particle beam apparatus 400 may comprise electrostatic beam deflection units. A first electrostatic beam deflection unit 409, which also may be embodied as a quadrupole in a further embodiment, is arranged between the second electrostatic lens 406 and the third electro-static lens 407. The first electrostatic beam deflection unit 409 is likewise arranged downstream of the magnetic deflection units 408. A first multi-pole unit 409A in the form of a first magnetic deflection unit may be arranged at one side of the first electrostatic beam deflection unit 409. Moreover, a second multi-pole unit 409B in the form of a second magnetic deflection unit may be arranged at the other side of the first electrostatic beam deflection unit 409. The first electrostatic beam deflection unit 409, the first multi-pole unit 409A, and the second multi-pole unit 409B may be set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 may be arranged at the entrance to the beam deflection device 410.

The beam deflection device 410 may be used as a particle beam deflector, which deflects the particle beam in a specific manner. The beam deflection device 410 may comprise a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and said particle beam may be deflected by the beam deflection device 410 in the direction of a second optical axis OA2. The beam deflection may be performed by means of the first magnetic sector 411A, by means of the second magnetic sector 411B and by means of the third magnetic sector 411C through an angle of 30° to 120°. The second optical axis OA2 may be oriented at the same angle with respect to the first optical axis OA1. The beam deflection device 410 also deflects the particle beam which may be guided along the second optical axis OA2, to be precise in the direction of a third optical axis OA3. The beam deflection may be provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 may be provided by deflection of the particle beam at an angle of 90°. Hence, the third optical axis OA3 extends coaxially with respect to the first optical axis OA1. However, reference is made to the fact that, according to an embodiment of the system described herein, the particle beam apparatus 400 described here is not restricted to deflection angles of 90°. Rather, any suitable deflection angle may be selected by the beam deflection device 410, for example, 70° or 110°, such that the first optical axis OA1 does not extend coaxially with respect to the third optical axis OA3. In respect of further details of the beam deflection device 410, reference is made to WO 2002/067286 A2.

After the particle beam has been deflected by the first magnetic sector 411A, the second magnetic sector 411B, and the third magnetic sector 411C, the particle beam may be guided along the second optical axis OA2. The particle beam may be guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, they may be deflected to the third optical axis OA3 by the third magnetic sector 411C, the fourth magnetic sector 411D, and the fifth magnetic sector 411E.

The electrons of the particle beam emerge from the beam deflection device 410 and said electrons may be guided along the third optical axis OA3 to an object 425 that is intended to be examined and is arranged in an object holder 114. On the path to the object 425, the particle beam may be guided to a fifth electrostatic lens 418, a beam guiding tube 420, a fifth multi-pole unit 418A, a sixth multi-pole unit 418B, and an objective lens 421. The fifth electrostatic lens 418 may be an electrostatic immersion lens. By way of the fifth electrostatic lens 418, the particle beam may be decelerated or accelerated to an electric potential of the beam guiding tube 420.

By means of the objective lens 421, the particle beam may be focused into a focal plane in which the object 425 is arranged. The object holder 114 may be arranged at a movable sample stage 424. The movable sample stage 424 may be arranged in a sample chamber 426 of the particle beam apparatus 400. The sample stage 424 may be embodied to be movable in three directions arranged perpendicular to one another, namely in an x-direction (first stage axis), in a y-direction (second stage axis) and in a z-direction (third stage axis). Moreover, the sample stage 424 may be rotated about two rotation axes which may be arranged perpendicular to one another (stage rotation axes). This will be discussed again in greater detail further below.

The sample chamber 426 may be under vacuum. For the purposes of generating the vacuum, a pump (not illustrated) may be arranged at the sample chamber 426. In the embodiment illustrated in FIG. 3, the sample chamber 426 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 426 may be vacuum-sealed.

The objective lens 421 may be embodied as a combination of a magnetic lens 422 and a sixth electrostatic lens 423. The end of the beam guiding tube 420 further may be an electrode of an electrostatic lens. After emerging from the beam guiding tube 420, particles of the particle beam apparatus may be decelerated to a potential of the object 425. The objective lens 421 is not restricted to a combination of the magnetic lens 422 and the sixth electrostatic lens 423. Rather, the objective lens 421 may assume any suitable form. By way of example, the objective lens 421 also may be embodied as a purely magnetic lens or as a purely electrostatic lens.

The particle beam which is focused onto the object 425 interacts with the object 425. Interaction particles may be generated. In particular, secondary electrons may be emitted from the object 425 or backscattered electrons may be backscattered at the object 425. The secondary electrons or the backscattered electrons may be accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 may comprise a first analysis detector 419, which is arranged between the beam deflection device 410 and the objective lens 421 along the beam path. Secondary electrons traveling in directions oriented at a large angle with respect to the third optical axis OA3 may be detected by the first analysis detector 419. Backscattered electrons and secondary electrons which have a small axial distance with respect to the third optical axis OA3 at the location of the first analysis detector 419—i.e. backscattered electrons and secondary electrons which have a small distance from the third optical axis OA3 at the location of the first analysis detector 419—enter the beam deflection device 410 and may be deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 generates detection signals which may be largely generated by emitted secondary electrons. The detection signals which are generated by the first analysis detector 419 may be guided to a control unit 123 and used to obtain information about the properties of the interaction region of the focused particle beam with the object 425. In particular, the focused particle beam may be scanned over the object 425 using a scanning device 429. By means of the detection signals generated by the first analysis detector 419, an image of the scanned region of the object 425 may then be generated and displayed on a display unit. The display unit is, for example, a monitor 124 that is arranged at the control unit 123.

The second analysis detector 428 is also connected to the control unit 123. Detection signals of the second analysis detector 428 may be passed to the control unit 123 and used to generate an image of the scanned region of the object 425 and to display it on a display unit. The display unit is, for example, the monitor 124 that is arranged at the control unit 123.

Arranged at the sample chamber 426 is a radiation detector 500, which may be used to detect interaction radiation, for example, x-ray radiation and/or cathodoluminescence. The radiation detector 500 may be connected to the control unit 123, which has the monitor 124. The control unit 123 processes detection signals of the radiation detector 500 and displays them in the form of images on the monitor 124.

The control unit 123 furthermore may have a database 126, in which data may be stored and from which data may be read out.

The particle beam apparatus 400 may comprise a component in the form of a gas feed device 1000, which serves to feed a gas, for example, a gaseous precursor substance, to a specific position on the surface of the object 125. The gas feed device 1000 has a gas reservoir 1001. By way of example, phenanthrene is used as a gaseous precursor substance. Essentially a layer of carbon or a carbon-containing layer then deposits on the surface of the object 125. As an alternative thereto, by way of example, a gaseous precursor substance comprising metal may be used in order to deposit a metal on the surface of the object 125. However, the depositions are not limited to carbon and/or metals. Rather, arbitrary substances may be deposited on the surface of the object 125, for example, semiconductors, non-conductors or other compounds. Furthermore, provision also may be made for a gas to be used for removing material of the object 125 upon interaction with the particle beam.

The gas feed device 1000 may be provided with a feed line 1002. The feed line 1002 may have, in the direction of the object 125, an acicular device in the form of a hollow tube 1003, which may be able to be brought into the vicinity of the surface of the object 125, for example, at a distance of 10 µm to 1 mm from the surface of the object 125. The hollow tube 1003 has a feed opening, the diameter of which is, for example, in the range of 10 µm to 1000 µm, in particular in the range of 400 µm to 600 µm. The feed line 1002 has a valve 1004 in order to regulate the flow rate of gas into the feed line 1002. To put it another way, when the valve 1004 is opened, gas from the gas reservoir 1001 may be introduced into the feed line 1002 and guided via the hollow tube 1003 to the surface of the object 125. When the valve 1004 is closed, the flow of the gas onto the surface of the object 125 may be stopped.

The gas feed device 1000 may be furthermore provided with an adjusting unit 1005, which enables an adjustment of the position of the hollow tube 1003 in all three spatial directions—namely an x-direction, a y-direction and a z-direction—and an adjustment of the orientation of the hollow tube 1003 by means of a rotation and/or a tilting. The gas feed device 1000 and thus also the adjusting unit 1005 may be connected to the control unit 123 of the particle beam apparatus 400.

In further embodiments, the gas reservoir 1001 may not be arranged directly at the gas feed device 1000. Rather, in said further embodiments, provision is made for the gas reservoir 1001 to be arranged, for example, at a wall of a space in which the particle beam apparatus is situated.

The gas feed device 1000 may have a temperature measuring unit 1006. By way of example, an infrared measuring apparatus or a semiconductor temperature sensor is used as temperature measuring unit 1006. However, the system described herein is not restricted to the use of such temperature measuring units. Rather, any suitable temperature measuring unit which is suitable for the system described herein may be used as temperature measuring unit. In particular, provision may be made for the temperature measuring unit not to be arranged at the gas feed device 1000 itself, but rather to be arranged, for example, at a distance from the gas feed device 1000.

Figure 4:
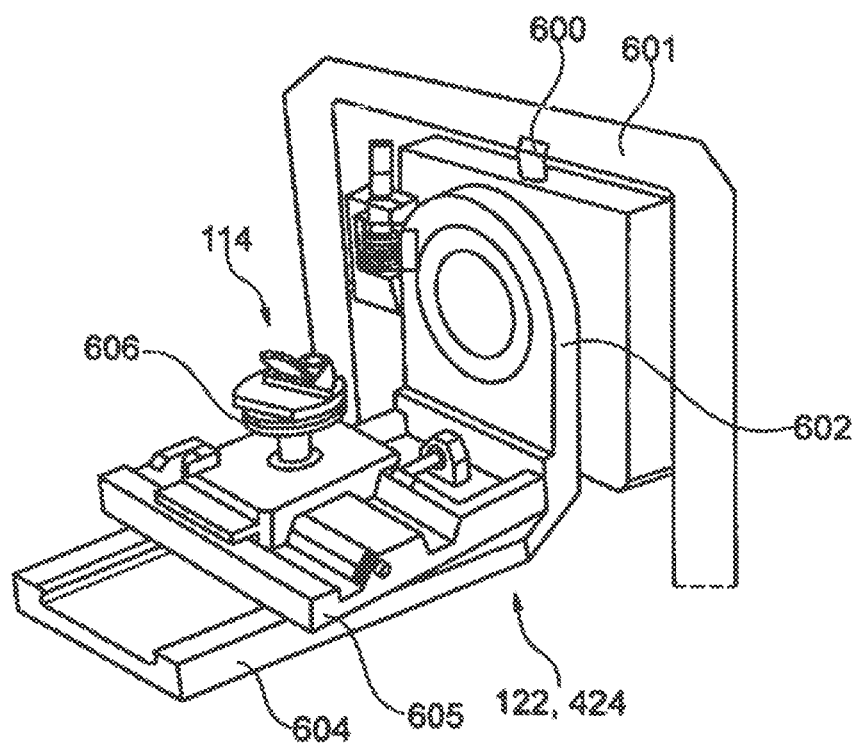
FIG. 4 shows a schematic illustration of a sample stage, according to an embodiment of the system described herein.

Now, the sample stage 122, 424 of the particle beam apparatuses 100, 200 and 400 explained above is discussed in more detail below. The sample stage 122, 424 may be embodied as a movable sample stage, which is illustrated schematically in FIGS. 4 and 5. Reference is made to the fact that the system described herein is not restricted to the sample stage 122, 424 described here. Rather, the system described herein may have any movable sample stage that is suitable for the system described herein.

Arranged on the sample stage 122, 424 is the object holder 114, in which the object 125, 425 may be arranged in turn. The sample stage 122, 424 may have movement elements that ensure a movement of the sample stage 122, 424 in such a way that a region of interest on the object 125, 425 may be examined by means of a particle beam. The movement elements are illustrated schematically in FIGS. 4 and 5 and are explained below.

The sample stage 122, 424 may have a first movement element 600 at a housing 601 of the sample chamber 120, 201 or 426, in which the sample stage 122, 424 is arranged. The first movement element 600 enables a movement of the sample stage 122, 424 along the z-axis (third stage axis). Further, provision may be made of a second movement element 602. The second movement element 602 enables a rotation of the sample stage 122, 424 about a first stage rotation axis 603, which is also referred to as a tilt axis. This second movement element 602 may serve to tilt an object 125, 425 arranged in the object holder 114 about the first stage rotation axis 603.

Arranged at the second movement element 602, in turn, may be a third movement element 604 that may be embodied as a guide for a slide and that ensures that the sample stage 122, 424 may be movable in the x-direction (first stage axis). The aforementioned slide may be a further movement element in turn, namely a fourth movement element 605. The fourth movement element 605 may be embodied in such a way that the sample stage 122, 424 is movable in the y-direction (second stage axis). To this end, the fourth movement element 605 may have a guide in which a further slide is guided, the object holder 114 in turn being arranged at the latter.

The object holder 114 may be embodied, in turn, with a fifth movement element 606, which enables a rotation of the object holder 114 about a second stage rotation axis 607. The second stage rotation axis 607 may be oriented perpendicular to the first stage rotation axis 603.

On account of the above-described arrangement, the sample stage 122, 424 of the embodiment discussed here may have the following kinematic chain: first movement element 600 (movement along the z-axis)—second movement element 602 (rotation about the first stage rotation axis 603)—third movement element 604 (movement along the x-axis)—fourth movement element 605 (movement along the y-axis)—fifth movement element 606 (rotation about the second stage rotation axis 607).

In a further embodiment (not illustrated), provision may be made for further movement elements to be arranged at the sample stage 122, 424 such that movements along further translational axes and/or about further rotation axes are made possible.

Figure 5:
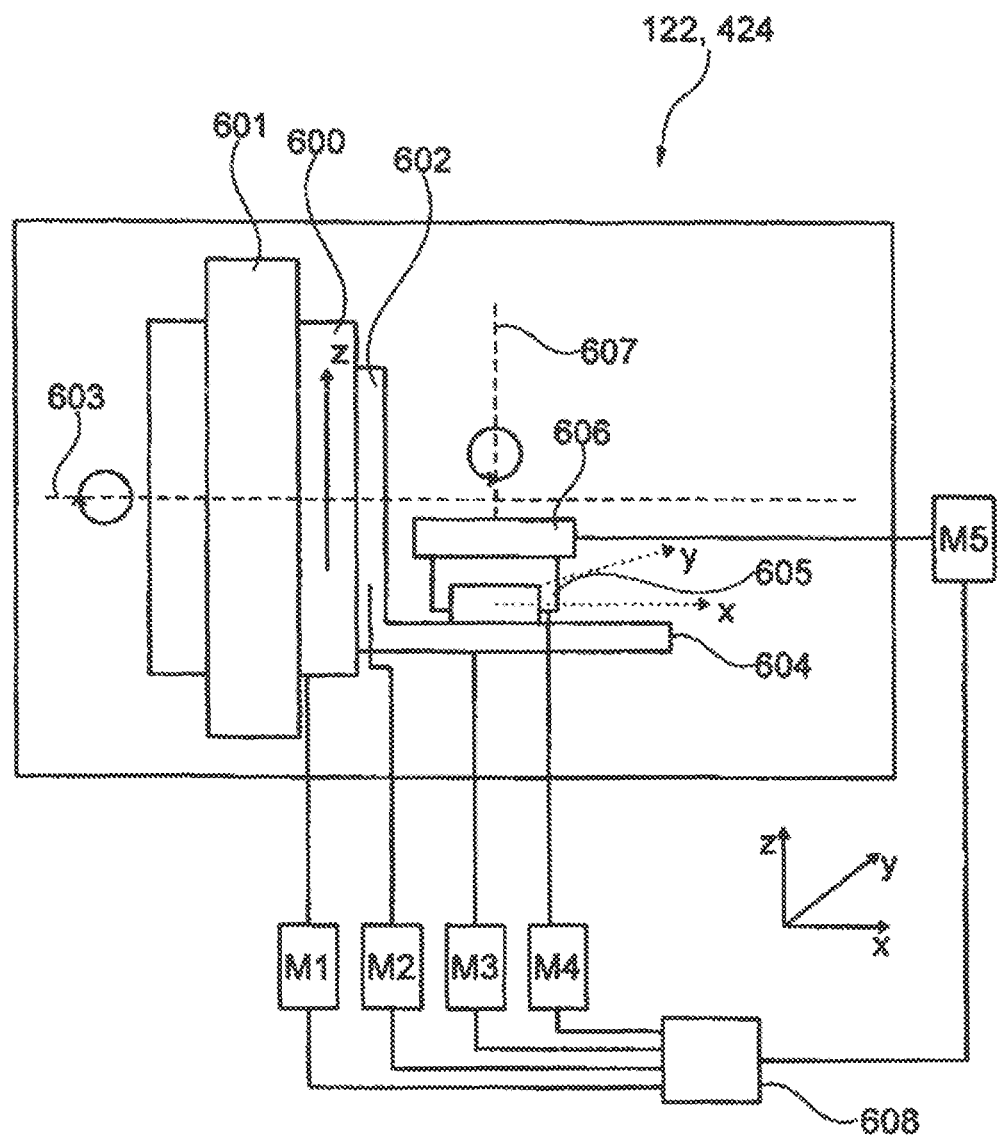
FIG. 5—shows a further schematic illustration of the sample stage according to FIG. 4, according to an embodiment of the system described herein.

It is clear from FIG. 5 that each of the aforementioned movement elements may be connected to a drive unit. Thus, the first movement element 600 may be connected to a first drive unit M1 and driven on account of a driving force that is provided by the first drive unit M1. The second movement element 602 may be connected to a second drive unit M2, which drives the second movement element 602. The third movement element 604 may be connected, in turn, to a third drive unit M3. The third drive unit M3 provides a driving force for driving the third movement element 604. The fourth movement element 605 may be connected to a fourth drive unit M4, wherein the fourth drive unit M4 drives the fourth movement element 605. Furthermore, the fifth movement element 606 may be connected to a fifth drive unit M5. The fifth drive unit M5 provides a driving force that drives the fifth movement element 606. The drive units M1 to M5 mentioned above may be embodied as stepper motors, for example, and may be controlled by a control unit 608 (cf. FIG. 5). It is explicitly pointed out that the system described herein is not restricted to the movement by means of stepper motors. Rather, any drive units may be used as drive unit.

The control unit 123 of the particle beam apparatus 100, 200 or 400 may be embodied as a processor or may comprise a processor. A computer program product comprising a program code which, when executed, carries out a method for operating the gas feed device 1000 may be loaded in the processor. This will be described by way of example in the case of carrying out the method in the combination apparatus 200. The same applies, mutatis mutandis, to carrying out the method in the SEM 100 and/or in the particle beam apparatus 400.

Figure 6:
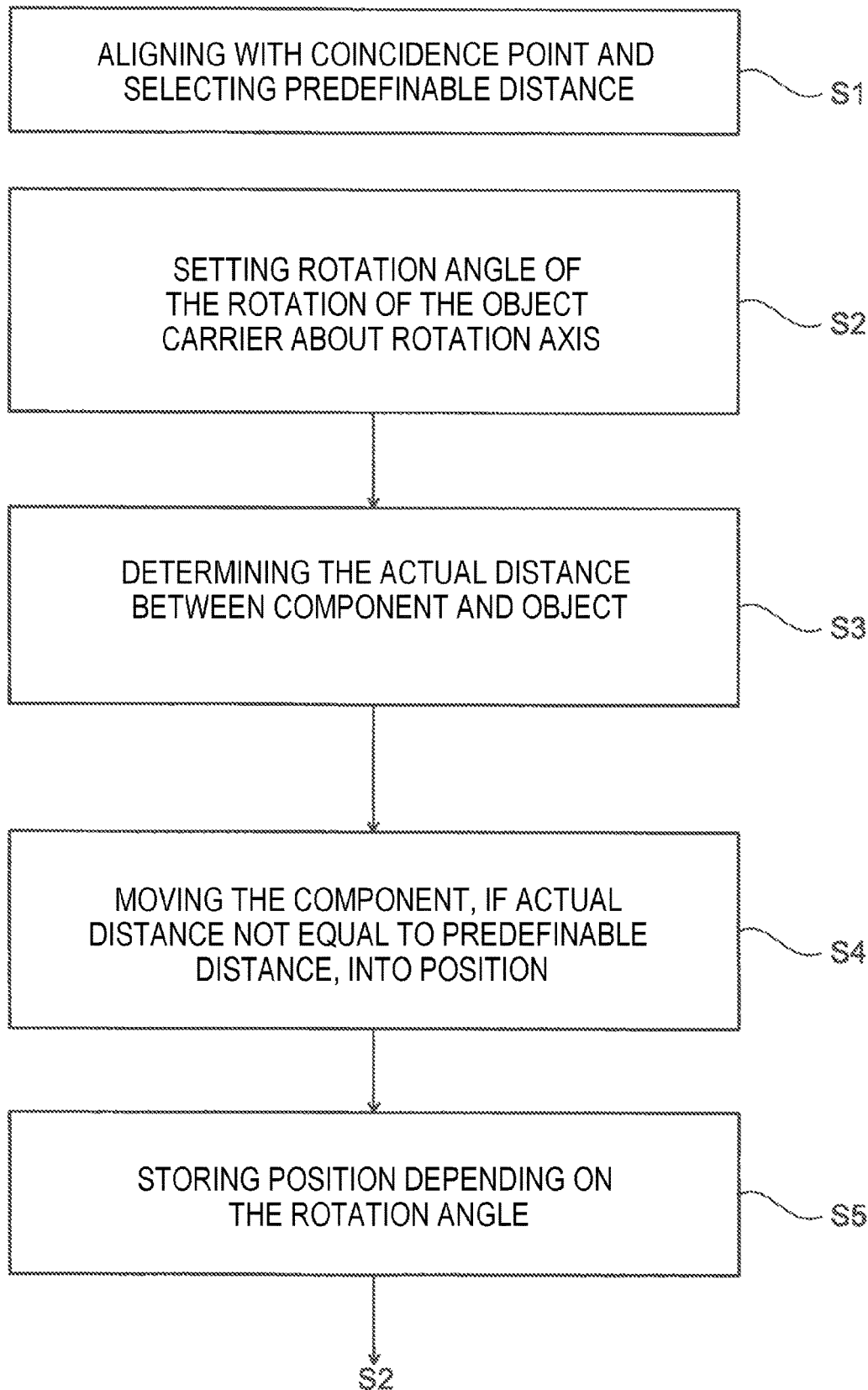
FIG. 6—shows one embodiment of a method according to an embodiment of the system described herein.

Firstly, initial method steps of the method according to an embodiment of the system described herein, which are illustrated in FIG. 6, may be carried out at the factory, for example. In particular, provision may be made for these initial method steps not to be carried out by a user of the combination apparatus 200. The initial method steps provide for ascertaining the position of the hollow tube 1003 of the gas feed device 1000 depending on the rotation angle of the rotation of the sample stage 122 about the first stage rotation axis 603, in which the hollow tube 1003 may be at a predefinable distance from the object 125.

Firstly, method step S1 may involve aligning the first hollow tube 1003 of the gas feed device 1000 with a coincidence point of the combination apparatus 200 and selecting the predefinable distance. The predefinable distance may be given by a setpoint distance, for example. The setpoint distance is the intended distance, for example, at least between the hollow tube 1003 of the gas feed device 1000 and the object 125. By way of example, the setpoint distance is in a range of 100 µm to 500 µm or in a range of 200 µm to 300 µm. By way of example, the setpoint distance is 250 µm.

The setpoint distance may be predefined, for example, by defining a setpoint position of the hollow tube 1003 of the gas feed device 1000. The setpoint position is that position which the hollow tube 1003 of the gas feed device 1000 is intended to assume and which may be selected in such a way that the advantages mentioned above and further below are achieved. In said setpoint position, the hollow tube 1003 of the gas feed device 1000, with its tip and opening, may be aligned sufficiently well with the region on the surface of the object 125 to which gas is intended to be guided.

Defining the setpoint position on the basis of the combination apparatus 200 will be explained in greater detail below. The setpoint position may be determined from empirical values, for example. However, it may also be calculated. This will now be explained in greater detail with reference to FIGS. 7 and 8.

Figure 7:
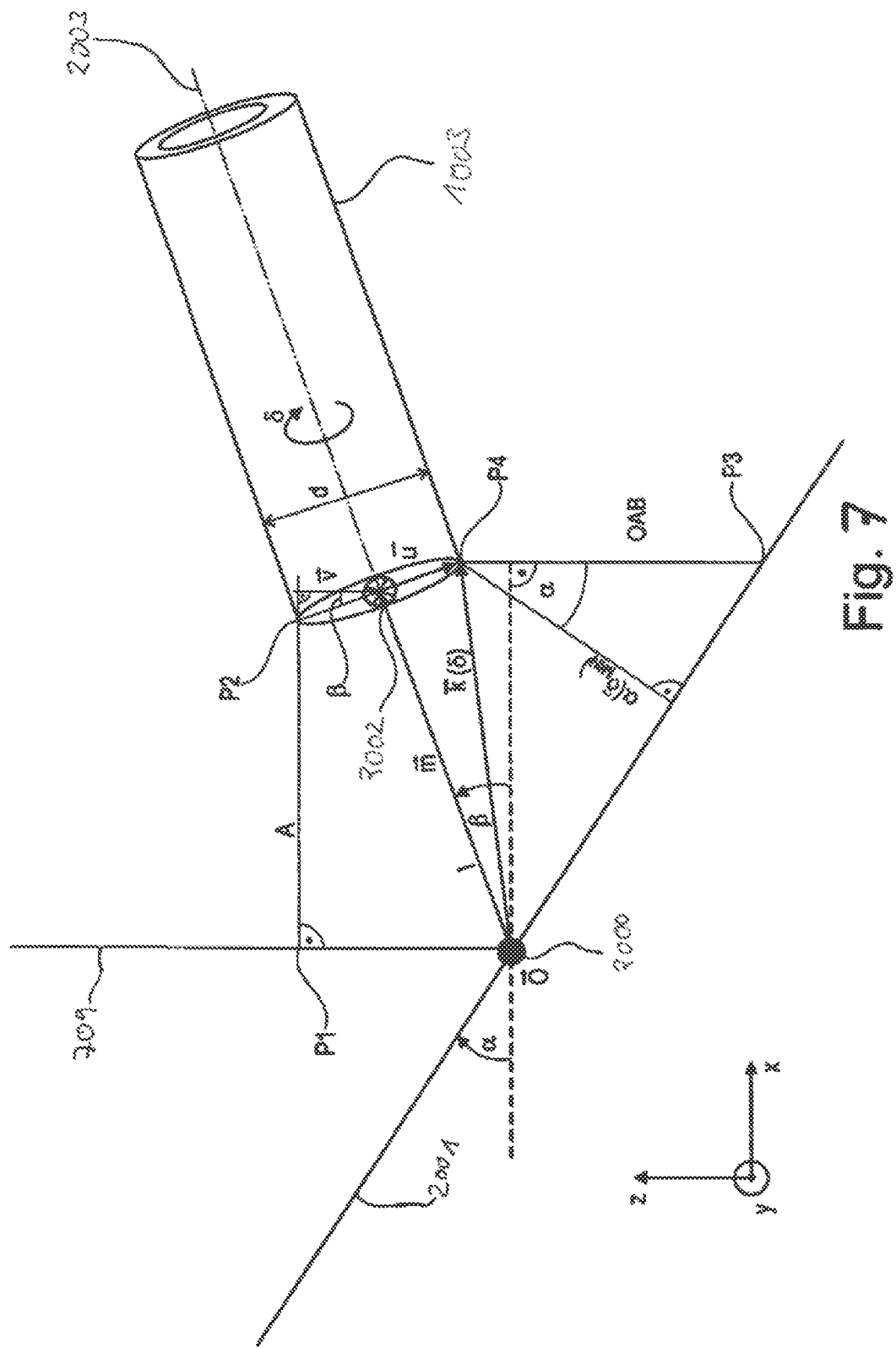
FIG. 7 shows a schematic illustration for elucidating the variables for calculating a setpoint position, according to an embodiment of the system described herein.
Figure 8:
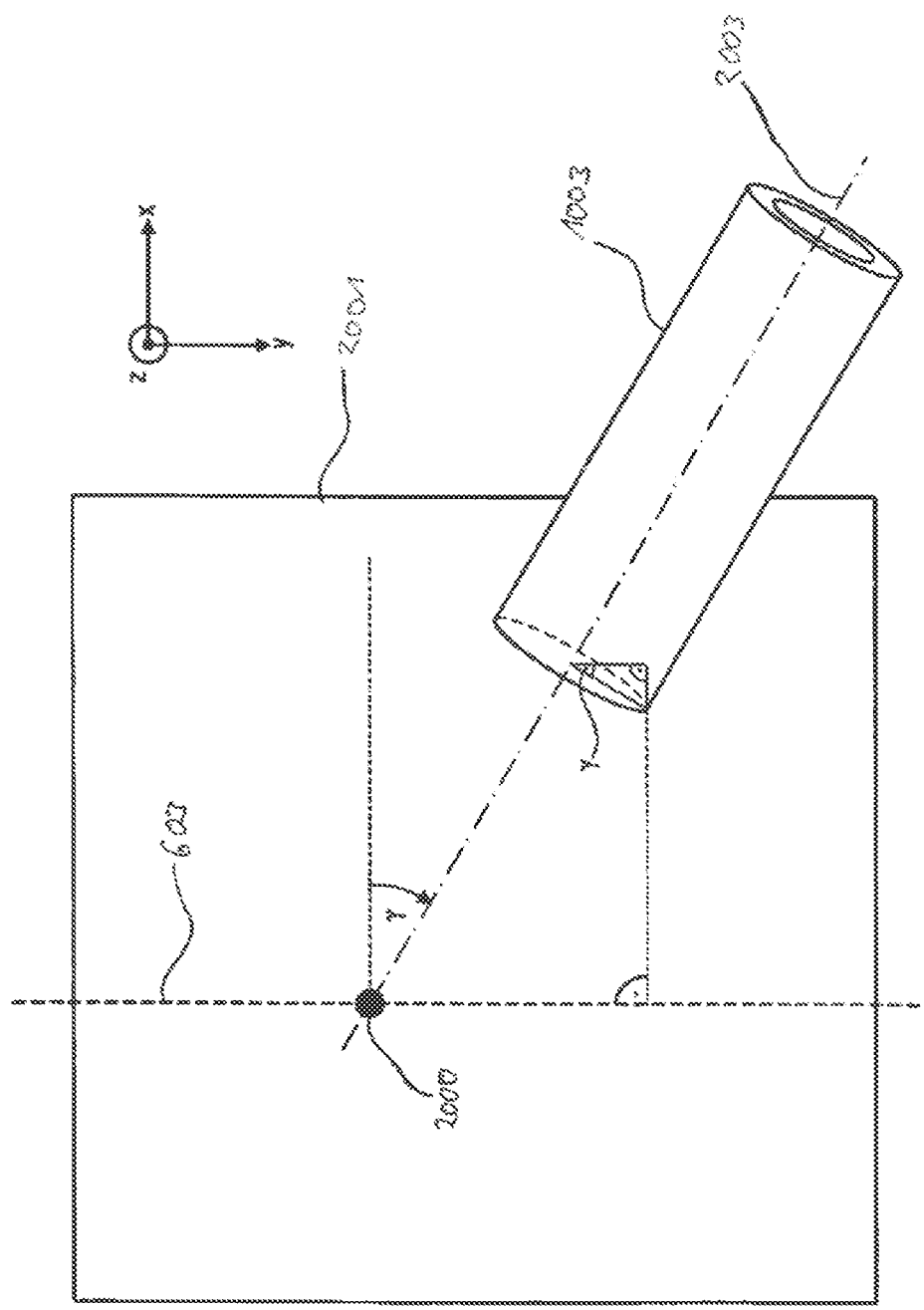
FIG. 8 shows a further schematic illustration for elucidating the variables for calculating the setpoint position, according to an embodiment of the system described herein.

FIG. 7 shows the first beam axis 709 of the SEM 100. At a coincidence point 2000, the second beam axis 710 (not illustrated in FIG. 7) of the ion beam apparatus 300 impinges on the first beam axis 709 of the SEM 100. The coincidence point 2000 lies on the surface 2001 of the object 125. The coincidence point 2000 is a processing point. To put it another way, that region on the surface 2001 of the object 125 which is intended to be processed and/or analyzed is situated at the coincidence point 2000. The hollow tube 1003 of the gas feed device 1000 is also illustrated in FIG. 7. The hollow tube 1003 has a cylindrical cross section. A longitudinal axis 2003 that is intended to be aligned with the coincidence point 2000 extends through a circle center 2002 of the cylindrical cross section. FIG. 8 shows a plan view of the arrangement illustrated schematically in FIG. 7 along the first beam axis 709 of the SEM 100.

Variables are depicted in FIGS. 7 and 8, the meaning of which variables will now be explained below.

The variable "A" denotes the axial distance between the first beam axis 709 and the edge of the hollow tube 1003. The axial distance A is given by the length of a straight line which is oriented perpendicular to the first beam axis 709 and which connects a point P1 on the first optical axis 709 to a point P2 on that surface of the hollow tube 1003 which is directed toward the first beam axis 709, wherein the point P1 on the first beam axis 709 is arranged closest to the point P2 on the surface of the hollow tube 1003.

The variable "d" denotes the outer effective diameter of the hollow tube 1003. It is defined by the geometry of the hollow tube 1003.

The angle "α" is the tilt angle of the surface 2001 of the object 125 with respect to the horizontal orientation of the surface 2001 of the object 125. The tilt angle α may be set by rotation about the first stage rotation axis 603.

The angle "β" corresponds to an angle of pitch of the hollow tube 1003. This is the angle between the longitudinal axis 2003 and the horizontal orientation of the surface 2001 of the object 125. Said angle is defined by the geometry of the hollow tube 1003 and of a sample chamber flange on which the gas feed device 1000 is arranged.

The angle "γ" is a rotation angle of the hollow tube 1003. This angle denotes the angular arrangement between the longitudinal axis 2003 and a straight line oriented both perpendicular to the first beam axis 709 and perpendicular to the first stage rotation axis 603. Furthermore, the angle γ is a projection angle obtained by the projection of the longitudinal axis 2003 into the plane of the object 125.

The object distance, that is to say the distance between a point P3 on the surface 2001 of the object 125 and a point P4 arranged on a surface of the hollow tube 1003 oriented with respect to the surface 2001 of the object 125, is designated by OAB. The object distance OAB is given by the length of a straight line which is oriented parallel to the first beam axis 709 and which connects the point P3 on the surface 2001 of the object 125 to the point P4 of the hollow tube 1003, said point being arranged closest to the point P3 on the surface 2001 of the object 125. The object distance OAB is a function of the variables A, d, α, β and γ. The following thus holds true for said object distance:

$$OAB = f(A, d, \alpha, \beta, \gamma)$$

I denotes the distance between the coincidence point 2000 and the hollow tube 1003. The distance I is also referred to as the working distance. The distance I is given by the length of a straight line which is the lengthening of the longitudinal axis 2003, wherein the lengthening extends through the circle center 2002 of the opening of the hollow tube 1003 and through the coincidence point 2000. The distance I is the length of the straight line between the coincidence point 2000 and the circle center 2002 of the opening. The working distance I is a function of the variables A, d, β and γ. The following thus holds true for said working distance:

$$I = f(A, d, \beta, \gamma).$$

With the variables mentioned above, which may be freely selected, it is then possible to calculate the associated object distance OAB, this unambiguously defining the setpoint position of the hollow tube 1003. The calculation is effected here as follows, wherein it is assumed to a first approximation that the surface 2001 of the object 125 is planar.

In the case of the embodiment discussed here, it is assumed that the following relationships hold true: $0° \leq \alpha \leq 90°$, $0° \leq \beta \leq 90°$ and $0° \leq \gamma \leq 360°$. It is furthermore assumed that the opening of the hollow tube 1003 to the first approximation is a circle arranged in a circle plane. The following unit vectors then form an orthonormal basis of the circle plane:

$$\vec{u} = \begin{pmatrix} u_x \\ u_y \\ u_z \end{pmatrix} = \frac{1}{\sqrt{(u'_x)^2 + (u'_y)^2 + (u'_z)^2}} \begin{pmatrix} u'_x \\ u'_y \\ u'_z \end{pmatrix} \quad [1]$$

$$\vec{v} = \begin{pmatrix} v_x \\ v_y \\ v_z \end{pmatrix} = \frac{1}{\sqrt{(v'_x)^2 + (v'_y)^2 + (v'_z)^2}} \begin{pmatrix} v'_x \\ v'_y \\ v'_z \end{pmatrix} \quad [2]$$

It is furthermore assumed that the coincidence point 2000 is the coordinate origin. The following vector is then the center vector, that is to say the vector extending from the coincidence point 2000 to the circle center 2002:

$$\vec{m} = \begin{pmatrix} m_x \\ m_y \\ m_z \end{pmatrix} \quad [3]$$

It is furthermore assumed that δ is the inscribed angle of the circle. Every point on the circle may then be described by the following vector:

$$\vec{k}(\delta) = \vec{m} + \frac{d}{2}(\vec{u}\cos\delta + \vec{v}\sin\delta) \quad [4]$$

On the basis of the geometric relationships present in FIGS. 7 and 8, the following then results for the coordinates of the center vector:

$$m_x = \left(x + \frac{d}{2}\sin\beta\right)\cos\gamma = x\cos\gamma + \frac{d}{2}\sin\beta\cos\gamma \quad [5]$$

$$m_y = m_x(\gamma = 0)\tan\beta = x\tan\beta + \frac{d}{2}\sin\beta\tan\beta \quad [6]$$

$$m_z = \left(x + \frac{d}{2}\sin\beta\right)\sin\gamma = x\sin\gamma + \frac{d}{2}\sin\beta\sin\gamma \quad [7]$$

The following thus results for the center vector:

$$\vec{m} = \left(x + \frac{d}{2}\sin\beta\right)\begin{pmatrix}\cos\gamma \\ \tan\beta \\ \sin\gamma\end{pmatrix} \quad [8]$$

The following then holds true for the working distance I between the coincidence point 2000 and the circle center 2002:

$$I = |\vec{m}| \quad [9]$$

On the basis of the geometric relationships present in FIGS. 7 and 8, it is possible to derive that the following then holds true for the orthonormal basis of the circle mentioned above:

$$u'_x = \frac{d}{2}\sin\beta\cos\gamma \quad [10]$$

$$u'_y = -\frac{d}{2}\cos\beta \quad [11]$$

$$u'_z = \frac{d}{2}\sin\beta\sin\gamma \quad [12]$$

$$\sqrt{(u'_x)^2 + (u'_y)^2 + (u'_z)^2} = \frac{d}{2}\sqrt{\sin^2\beta + \cos^2\gamma + \cos^2\beta + \sin^2\beta\sin^2\gamma} \quad [13]$$

$$v'_x = \frac{d}{2}\sin\gamma \quad [14]$$

$$v'_y = 0 \quad [15]$$

$$v'_z = -\frac{d}{2}\cos\gamma \quad [16]$$

$$\sqrt{(v'_x)^2 + (v'_y)^2 + (v'_z)^2} = \frac{d}{2}\sqrt{\sin^2\gamma + \cos^2\gamma} = \frac{d}{2} \quad [17]$$

Furthermore, basis unit vectors of the opening of the hollow tube 1003 may be described as follows:

$$\vec{u} = \frac{1}{\sqrt{\sin^2\beta\cos^2\gamma + \cos^2\beta + \sin^2\beta\sin^2\gamma}} \begin{pmatrix} \sin\beta\cos\gamma \\ -\cos\beta \\ \sin\beta\sin\gamma \end{pmatrix} \quad [18]$$

$$\vec{v} = \begin{pmatrix} \sin\gamma \\ 0 \\ -\cos\gamma \end{pmatrix} \quad [19]$$

The surface of the object may be described by a normed vector. For the latter it holds true that:

$$\vec{n} = \begin{pmatrix} n_x \\ n_y \\ n_z \end{pmatrix} = \frac{1}{\sqrt{(n'_x)^2 + (n'_y)^2 + (n'_z)^2}} \begin{pmatrix} n'_x \\ n'_y \\ n'_z \end{pmatrix} \quad [20]$$

The following results on the basis of the geometric relationships present in FIGS. 7 and 8:

$$\vec{n} = \begin{pmatrix} n_x \\ n_y \\ 0 \end{pmatrix} = \frac{1}{\sqrt{(n'_x)^2 + (n'_y)^2}} \begin{pmatrix} n'_x \\ n'_y \\ 0 \end{pmatrix} \quad [21]$$

Furthermore, on the basis of the geometric relationships present in FIGS. 7 and 8, it is evident that $$n'_x = b \sin\alpha \quad [22]$$

$$n'_y = b \cos\beta \quad [23]$$

$$\sqrt{(n'_x)^2 + (n'_y)^2} = b\sqrt{\sin^2\alpha + \cos^2\alpha} = b \quad [24]$$

wherein the parameter b may be chosen arbitrarily. The normal unit vector may thus be described as follows:

$$\vec{n} = \begin{pmatrix} n_x \\ n_y \\ 0 \end{pmatrix} = \begin{pmatrix} \sin\alpha \\ \cos\alpha \\ 0 \end{pmatrix} \quad [25]$$

The distance "a" between an arbitrary point on the above-mentioned circle and the plane of the object surface then results from:

$$a(\delta) = \vec{n}\vec{k}(\delta) = \vec{n}\vec{m} + \frac{d}{2}\vec{n}\vec{u}\cos\delta + \frac{d}{2}\vec{n}\vec{v}\sin\delta \quad [26]$$

The minimum is then determined in order to ascertain the shortest distance a. Said minimum is given if the first derivative of a(δ) is equal to zero and the second derivative of a(δ) is greater than zero.

The first derivative is $$a'(\delta) = -\frac{d}{2}\vec{n}\vec{u}\sin\delta + \frac{d}{2}\vec{n}\vec{v}\cos\delta \quad [27]$$

With the requirement that the first derivative is intended to be equal to zero, the following is evident:

$$-\frac{d}{2}\vec{n}\vec{u}\sin\delta_0 + \frac{d}{2}\vec{n}\vec{v}\cos\delta_0 = 0 \quad [28]$$

$$\Leftrightarrow \tan\delta_0 = \frac{\sin\delta_0}{\cos\delta_0} = \frac{\vec{n}\vec{v}}{\vec{n}\vec{u}} \quad [29]$$

$$\Leftrightarrow \delta_0 = \arctan\frac{\vec{n}\vec{v}}{\vec{n}\vec{u}} \quad [30]$$

For the second derivative it then holds true that:

$$a''(\delta) = -\frac{d}{2}\vec{n}\vec{u}\cos\delta - \frac{d}{2}\vec{n}\vec{v}\sin\delta \quad [31]$$

It is then necessary to draw a distinction between two cases, namely firstly if the second derivative is less than zero (case 1), and secondly if the second derivative is greater than zero (case 2).

For case 1 it holds true that:

$$a''(\delta_0) = -\frac{d}{2}\vec{n}\vec{u}\cos\delta_0 - \frac{d}{2}\vec{n}\vec{v}\sin\delta_0 < 0 \quad [32]$$

It then holds true that:

$$\delta_0 = \delta_{min} = artan\frac{\vec{n}\vec{v}}{\vec{n}\vec{u}} + \pi \quad [33]$$

For case 2 it holds true that:

$$a''(\delta_0) = -\frac{d}{2}\vec{n}\vec{u}\cos\delta_0 - \frac{d}{2}\vec{n}\vec{v}\sin\delta_0 > 0 \quad [34]$$

Furthermore, it then holds true that:

$$\delta_0 = \delta_{min} = artan\frac{\vec{n}\vec{v}}{\vec{n}\vec{u}} \quad [35]$$

Taking account of the geometric relationships present in FIGS. 7 and 8, it then holds true that:

$$OAB = \frac{a(\delta_{min})}{\cos\alpha} = \frac{\vec{n}\vec{m} + \frac{d}{2}(\vec{n}\vec{u})\cos\delta_{MIN} + \frac{d}{2}(\vec{n}\cdot\vec{v})\sin\delta_{MIN}}{\cos\alpha} \quad [36]$$

The setpoint position then may be unambiguously determined by the definition of the axial distance A associated with the setpoint position and the calculation of the associated object distance OAB.

If the setpoint position and thus the predefinable distance have been determined, then in a method step S2 the sample stage 122 may be selected and set by a selected rotation angle about the first stage rotation axis 603. Accordingly, the sample stage 122 may be rotated about the first stage rotation axis 603 by the selected rotation angle α. By way of example, the rotation angle α is in a range of between 0° and 90° with respect to the optical axis OA of the SEM 100, the range limits being concomitantly included here.

A method step S3 may involve determining an actual distance between the hollow tube 1003 of the gas feed device 1000, and the object 125. By way of example, the actual distance is ascertained by an imaging of the object 125 and of the hollow tube 1003 of the gas feed device 1000 being generated by the SEM 100 and the imaging created being used for determining the actual distance. By way of example, the actual distance is the working distance I between the coincidence point 2000 and the circle center 2002 or the object distance OAB.

In addition or as an alternative thereto, provision may be made for ascertaining the actual distance by means of a light-optical microscope (not illustrated), for example, which is arranged at the combination apparatus 200.

In addition or as an alternative thereto, in turn, provision is made for determining the actual distance as follows. The hollow tube 1003 of the gas feed device 1000 may be moved from a first starting position, in which the hollow tube 1003 of the gas feed device 1000 is situated, relatively in the direction of the object 125, which is situated in a second starting position, until the hollow tube 1003 of the gas feed device 1000 touches the object 125. Accordingly, the hollow tube 1003 of the gas feed device 1000 and/or the object 125 may be moved by the sample stage 122 until the hollow tube 1003 of the gas feed device 1000 touches the object 125.

When the hollow tube 1003 of the gas feed device 1000 touches the object 125, an adjustment distance covered by the hollow tube 1003 of the gas feed device 1000 and/or the object 125 during the movement may be determined, wherein the adjustment distance extends along a straight line connecting a first point on the hollow tube 1003 of the gas feed device 1000 in the first starting position to a second point on the object 125 in the second starting position, said second point being arranged closest to the first point on the hollow tube 1003 of the gas feed device 1000 along this straight line, wherein the adjustment distance corresponds to the actual distance.

When the actual distance between the hollow tube 1003 and the surface 2001 of the object 125 has been determined, then in a method step S4 it may be provided that if the actual distance does not correspond to the predefinable distance, the hollow tube 1003 of the gas feed device 1000 is moved into a position by means of the adjusting unit 1005 in such a way that the hollow tube 1003 is at the predefinable distance from the surface 2001 of the object 125. Furthermore, in a method step S5, this position of the hollow tube 1003, depending on the rotation angle α selected in method step S2, may be stored in the database 126. Furthermore, by way of example, a parameter set of the adjusting unit 1005 associated with this position of the hollow tube 1003 may be stored in the database 126. If the parameter set is used for the operation of the adjusting unit 1005, then the hollow tube 1003 may be moved by means of the adjusting unit 1005 into this position in which the hollow tube 1003 may be at the predefinable distance from the surface 2001 of the object 125.

In this embodiment of the method t of the system described herein, provision is made for carrying out method steps S2 to S5 repeatedly in such a way that a plurality of positions are determined for a plurality of different rotation angles α of the rotation of the sample stage 122 about the first stage rotation axis 603 and are stored in the database 126 depending on the respective rotation angles α. To put it another way, this embodiment of the method of the system described herein may involve determining a first position depending on a first rotation angle α and a second position depending on a second rotation angle α, wherein the hollow tube 1003 both in the first position and in the second position is at the predefinable distance from the surface 2001 of the object 125. In particular, this embodiment of the method of the system described herein provides for ascertaining a multiplicity of positions depending on respectively different rotation angles α of the rotation of the sample stage 122, in which in each case the distance between the hollow tube 1003 and the surface 2001 of the object 125 corresponds to the predefinable distance. The multiplicity may be, for example, more than 3 positions, more than 8 positions or more than 10 positions depending on different rotation angles α of the rotation of the sample stage 122.

Figure 9:
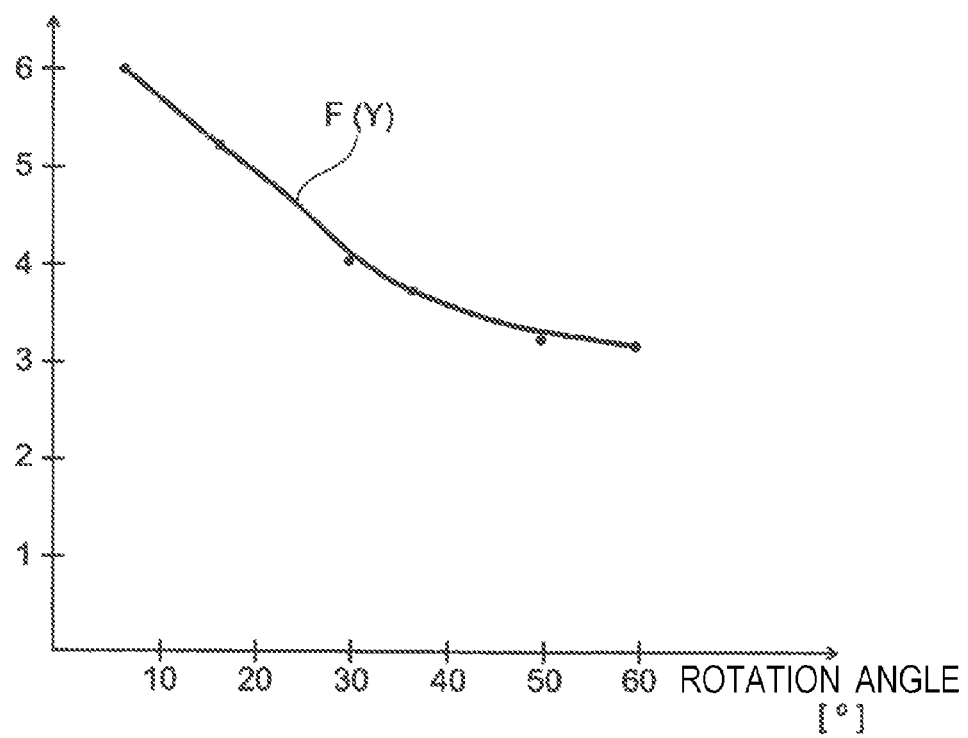
FIG. 9 shows a graphical illustration of the dependence of a coordinate of the position of a gas feed device as a function of a rotation angle of a rotation of a sample stage, according to an embodiment of the system described herein.

FIG. 9 shows, for example, 6 positions determined by method steps S2 to S5 mentioned above. 10°, 20°, 30°, 40°, 50°, and 60° were selected as rotation angles. In FIG. 9, coordinates along the y-axis for the determined positions mentioned above are plotted as a function of the rotation angle α, wherein a coordinate system having its origin at the coincidence point 2000 was selected as the coordinate system. The same may also analogously be done with the coordinates along the x-axis and the z-axis for the determined positions mentioned above. The smaller the rotation angle α, the further away from the surface 2001 of the object 125 the hollow tube 1003 may be arranged in order that the predefinable distance is achieved.

The embodiment of the method of the system described herein as illustrated in FIG. 9 may involve determining a functional relationship F(y) with respect to the coordinates of the determined positions as a function of the selected rotation angle α. The functional relationship F(y) may be a linear relationship or a nonlinear relationship. A step function may by all means also be comprised by the functional relationship F(y) or forms the functional relationship F(y). By way of example, the functional relationship F(y) may be determined by an interpolation. Any suitable interpolation method, for example, a linear interpolation, a nonlinear interpolation, a trigonometric interpolation, a logarithmic interpolation and/or a spline interpolation, may be used in the interpolation. In addition and/or as an alternative thereto, provision is made for determining the functional relationship F(y) by extrapolation. Any suitable extrapolation method, for example, a linear extrapolation, a nonlinear extrapolation, a trigonometric extrapolation and/or a logarithmic extrapolation, may be used in the extrapolation. As an alternative or in addition thereto, the functional relationship F(y) may be determined by forming an average, ascertaining random values and/or determining the smallest value or the largest value from the set of the first value and the second value. The functional relationship F(y) determined is likewise stored in the database 126 of the storage unit 123. The same may also analogously be done with the coordinates along the x-axis and the z-axis for the determined positions mentioned above.

Figure 10:
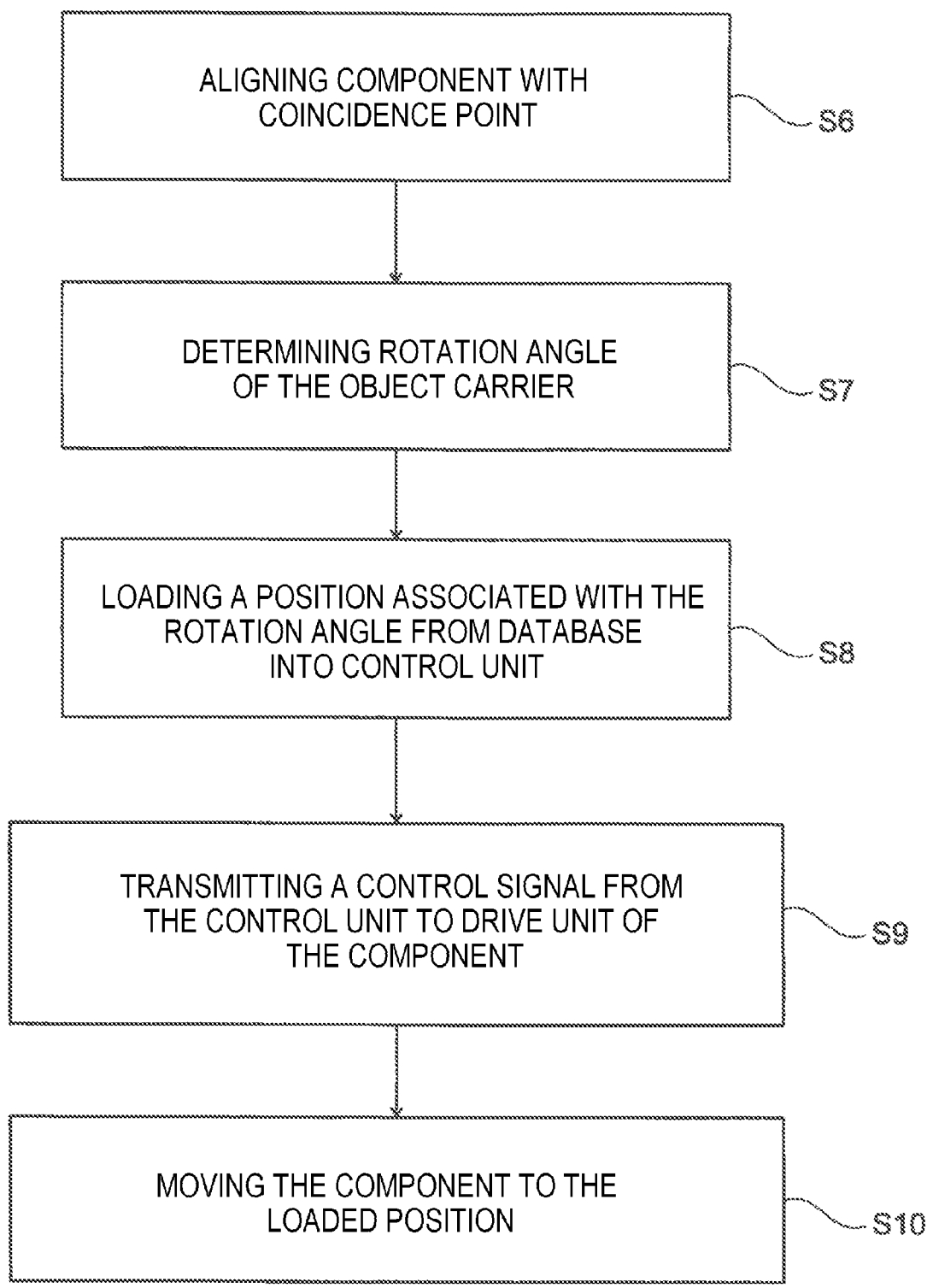
FIG. 10 shows a further embodiment of a method according to an embodiment of the system described herein.

FIG. 10 shows method steps of one embodiment of the method of the system described herein. These method steps may be carried out, for example, by a user of the combination apparatus 200. A method step S6 may involve aligning the hollow tube 1003 with the coincidence point 2000. This is carried out, for example, as described above. A method step S7 may involve determining a rotation angle α of a rotation of the sample carrier 122 about the first stage rotation axis 603. Determining the rotation angle α is carried out, for example, by reading off the rotation angle α on a display unit of the control unit 123, which receives a measurement signal from a rotation angle sensor of the sample stage 122. Furthermore, a method step S8 may involve loading a position of the hollow tube 1003 associated with the rotation angle from the database 126 into the control unit 123. This is, for example, a position which was ascertained and stored by means of method steps S1 to S5 or is determinable by means of the functional relationship. To put it another way, that position of the hollow tube 1003 which the hollow tube 1003 is intended to assume if the sample stage 122 has been rotated about the first stage rotation axis 603 by the rotation angle α determined may be loaded from the database 126. Furthermore, the embodiment illustrated in FIG. 10 may comprise transmitting a control signal from the control unit 123 to the adjusting unit 1005, by which the hollow tube 1003 is moved. By way of example, the adjusting unit 1005 is embodied as a piezoactuator. The control signal may have, in particular, the parameter set for the adjusting unit 1005 with which the hollow tube 1003 is moved into the position loaded from the database 126. The embodiment of the method of the system described herein also may comprise moving the hollow tube 1003 into the position loaded from the database 126 by means of the adjusting unit 1005. When the hollow tube 1003 is arranged in the position loaded from the database 126, the hollow tube 1003 is at the predefinable distance from the surface 2001 of the object 125. The position then assumed by the hollow tube 1003 is also referred to as the processing position.

Figure 11:
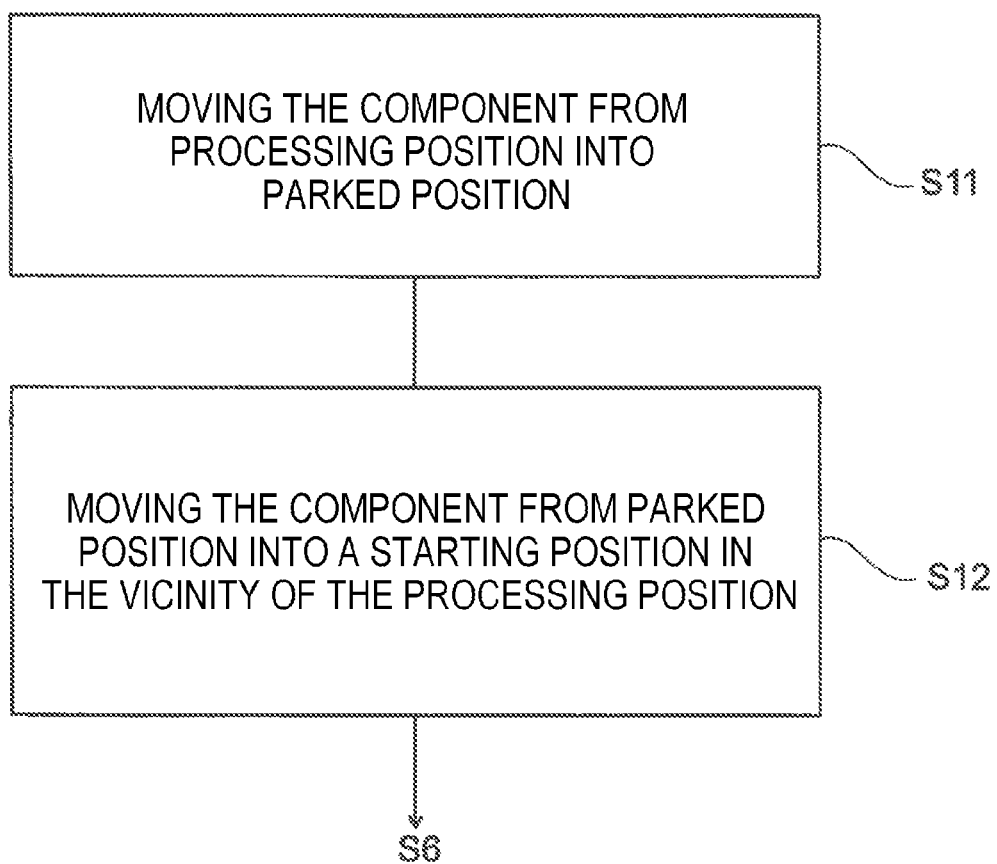
FIG. 11 shows an in turn further embodiment of a method according to an embodiment of the system described herein.

A further embodiment of the method of the system described herein is illustrated in FIG. 11. In order that the hollow tube 1003 does not disturb further processes for imaging, analyzing and/or processing the object 125 in the combination apparatus 200, it is known to move the hollow tube 1003 from the processing position into a parked position (method step S11). The parked position is situated, for example, a few centimeters away from the processing position, for example, in a range of 2 cm to 20 cm or 5 cm to 10 cm. In particular, the hollow tube 1003 may be moved away from the object 125 along the longitudinal axis 2003 by means of a further drive unit in the form of a compressed air actuator. In the processing position of the hollow tube 1003, gas may be guided to the object 125. In the parked position, by contrast, no gas may be guided to the object 125. The hollow tube 1003 may be arranged in the parked position in such a way that the hollow tube 1003 does not influence further processes for imaging, analyzing and/or processing the object 125 by means of the combination apparatus 200. If it is desired to feed gas to the object 125 again, the hollow tube 1003 may be moved into the processing position again. This may be done in two steps. In a first step the hollow tube 1003 may be moved from the parked position into a starting position in the vicinity of the processing position (method step S12). The starting position is at a distance from the processing position of approximately 500 μm to 1000 μm, for example. The movement of the hollow tube 1003 from the parked position into the starting position may be carried out, for example, by means of the further drive unit in the form of the compressed air actuator. The first adjustment distance covered in the process between the parked position and the starting position may be in the range of 2 cm to 20 cm or 5 cm to 10 cm, for example. Furthermore, method steps S6 to S10 may be carried out in a second step. The hollow tube 1003 may be thus moved from the starting position into the position loaded from the database by means of the adjusting unit 1005, wherein a second adjustment distance from the starting position to the processing position, for example, in the range of 50 μm to 300 μm or in the range of 100 μm to 200 μm is covered.

The method described above has the advantage that the hollow tube 1003 in the combination apparatus 200 always assumes the position in which the hollow tube 1003 is at the predefinable distance from the object 125. By way of example, this is the smallest possible distance from the object 125. The smallest possible distance is, for example, the distance with which the hollow tube 1003 achieves a sufficiently or even particularly good technical effect and with which the hollow tube 1003 does not disturb further processes carried out by the combination apparatus 200. In particular, it is possible to achieve a sufficiently good deposition of material on the surface 2001 of the object 125 or a sufficiently good removal of material on the surface 2001 of the object 125. Furthermore, the method according to an embodiment of the system described herein provides a possibility of arranging the hollow tube 1003 in an automated manner in the position in which it is at the predefinable distance. Furthermore, the method according to an embodiment of the system described herein ensures that the hollow tube 1003 may be brought very rapidly from the parked position, which is at a distance of a few centimeters from the object 125, into the processing position, in which the hollow tube 1003 is at the predefinable distance from the object 125.

As mentioned above, the control unit 123 of the particle beam apparatus 100, 200 or 400 may be embodied as a processor or may comprise a processor. A computer program product comprising a program code which, when executed, also carries out a further method for operating the gas feed device 1000 may be loaded in the processor. This will be described by way of example in the case of carrying out the method in the combination apparatus 200. The same applies, mutatis mutandis, with regard to the SEM 100 and the particle beam apparatus 400.

Figure 12:
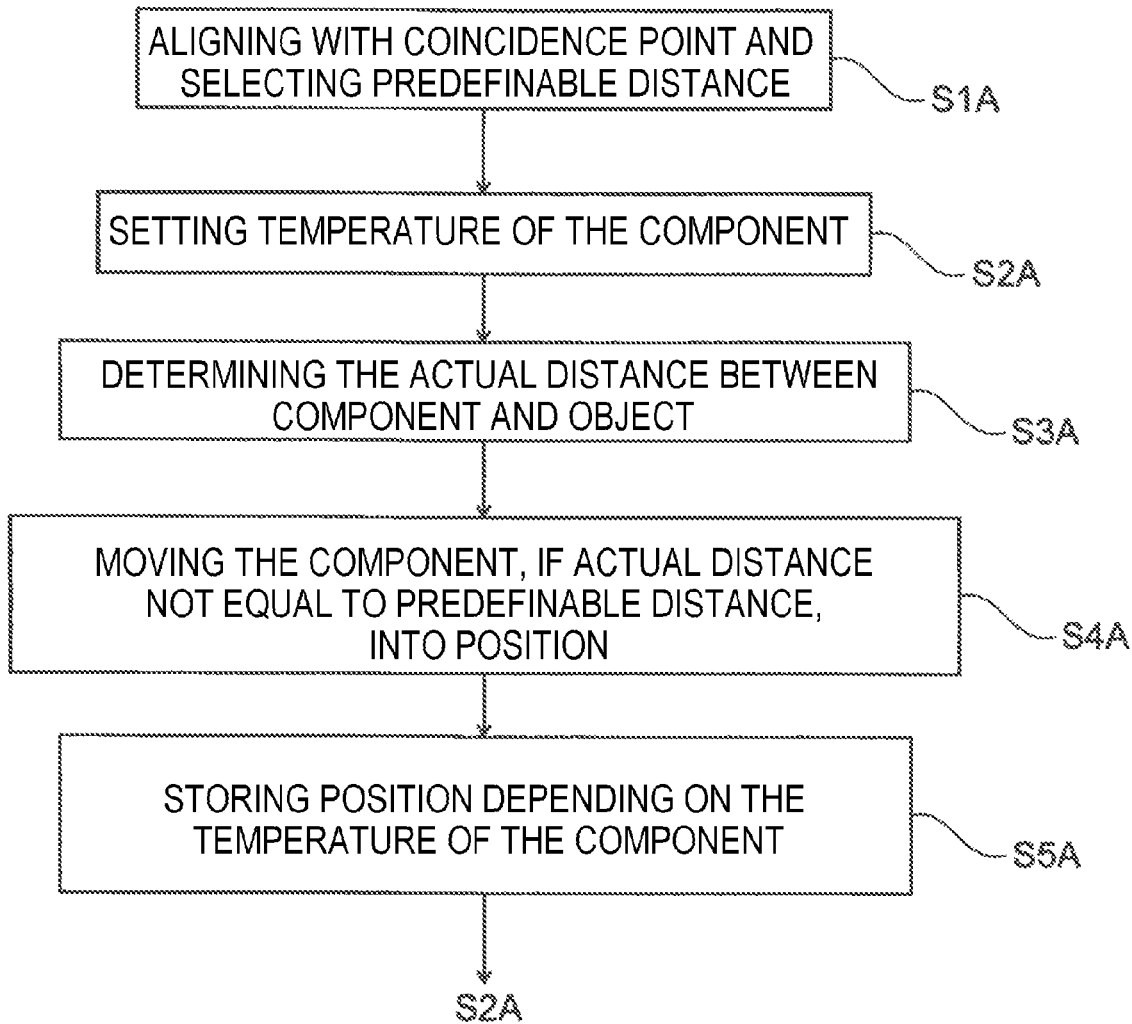
FIG. 12 shows one embodiment of a further method according to an embodiment of the system described herein.

Firstly, initial method steps of the further method according to an embodiment of the system described herein, which are illustrated in FIG. 12, may be carried out at the factory, for example. In particular, provision may be made for these initial method steps not to be carried out by a user of the combination apparatus 200. The initial method steps provide for ascertaining the position of the hollow tube 1003 of the gas feed device 1000 depending on the temperature of the hollow tube 1003. When the hollow tube 1003 is arranged in the position, it may be at a predefinable distance from the object 125.

Firstly, in the further method according to an embodiment of the system described herein, method step S1A may involve aligning the first hollow tube 1003 of the gas feed device 1000 with the coincidence point of the combination apparatus 200 and selecting the predefinable distance. The predefinable distance may be given by a setpoint distance, for example. The setpoint distance is the intended distance, for example, at least between the hollow tube 1003 of the gas feed device 1000 and the object 125. By way of example, the setpoint distance is in a range of 100 μm to 500 μm or in a range of 200 μm to 300 μm. By way of example, the setpoint distance is 250 μm. The setpoint distance is determined, for example, by defining a setpoint position of the hollow tube 1003 of the gas feed device 1000. The setpoint position is that position which the hollow tube 1003 of the gas feed device 1000 is intended to assume and which may be selected in such a way that the advantages mentioned above and further below are achieved. In said setpoint position, the hollow tube 1003 of the gas feed device, with its tip and opening, may be aligned sufficiently well with the region on the surface of the object 125 to which gas is intended to be guided. The setpoint position may be ascertained in the same way as already explained above.

When the setpoint position and thus the predefinable distance have been determined, a method step S2A then may involve setting the temperature of the hollow tube 1003 by means of a heating device 1007, for example, a resistance heating system. The setting may be effected to a desired temperature, for example, in the range of 10° C. to 60° C., the range limits being concomitantly included here.

A method step S3A may involve determining an actual distance between the hollow tube 1003 of the gas feed device 1000, and the object 125. By way of example, the actual distance is ascertained by an imaging of the object 125 and of the hollow tube 1003 of the gas feed device 1000 being generated by the SEM 100 and the imaging created being used for determining the actual distance. By way of example, the actual distance is the working distance I between the coincidence point 2000 and the circle center 2002 or the object distance OAB.

In addition or as an alternative thereto, provision may be made for ascertaining the actual distance by means of a light-optical microscope (not illustrated), for example, which is arranged at the combination apparatus 200.

In addition or as an alternative thereto, in turn, provision may be made for determining the actual distance as follows. The hollow tube 1003 of the gas feed device 1000 is moved from a first starting position, in which the hollow tube 1003 of the gas feed device 1000 is situated, relatively in the direction of the object 125, which is situated in a second starting position, until the hollow tube 1003 of the gas feed device 1000 touches the object 125. Accordingly, the hollow tube 1003 of the gas feed device 1000 and/or the object 125 may be moved by the sample stage 122 until the hollow tube 1003 of the gas feed device 1000 touches the object 125. When the hollow tube 1003 of the gas feed device 1000 touches the object 125, an adjustment distance covered by the hollow tube 1003 of the gas feed device 1000 and/or the object 125 during the movement is determined, wherein the adjustment distance extends along a straight line connecting a first point on the hollow tube 1003 of the gas feed device 1000 in the first starting position to a second point on the object 125 in the second starting position, said second point being arranged closest to the first point on the hollow tube 1003 of the gas feed device 1000 along this straight line, wherein the adjustment distance corresponds to the actual distance.

When the actual distance between the hollow tube 1003 and the surface 2001 of the object 125 has been determined, then in a method step S4A it may be provided that if the actual distance does not correspond to the predefinable distance, the hollow tube 1003 of the gas feed device 1000 may be moved into a position by means of the adjusting unit 1005 in such a way that the hollow tube 1003 is at the predefinable distance from the surface 2001 of the object 125. Furthermore, in a method step SSA, this position of the hollow tube 1003, depending on the temperature of the hollow tube 1003 selected in method step S2A, may be stored in the database 126. Furthermore, by way of example, a parameter set of the adjusting unit 1005 associated with this position of the hollow tube 1003 is stored in the database 126. If the parameter set is used for the operation of the adjusting unit 1005, then the hollow tube 1003 may be moved by means of the adjusting unit 1005 into this position in which the hollow tube 1003 is at the predefinable distance from the surface 2001 of the object 125.

Figure 13:
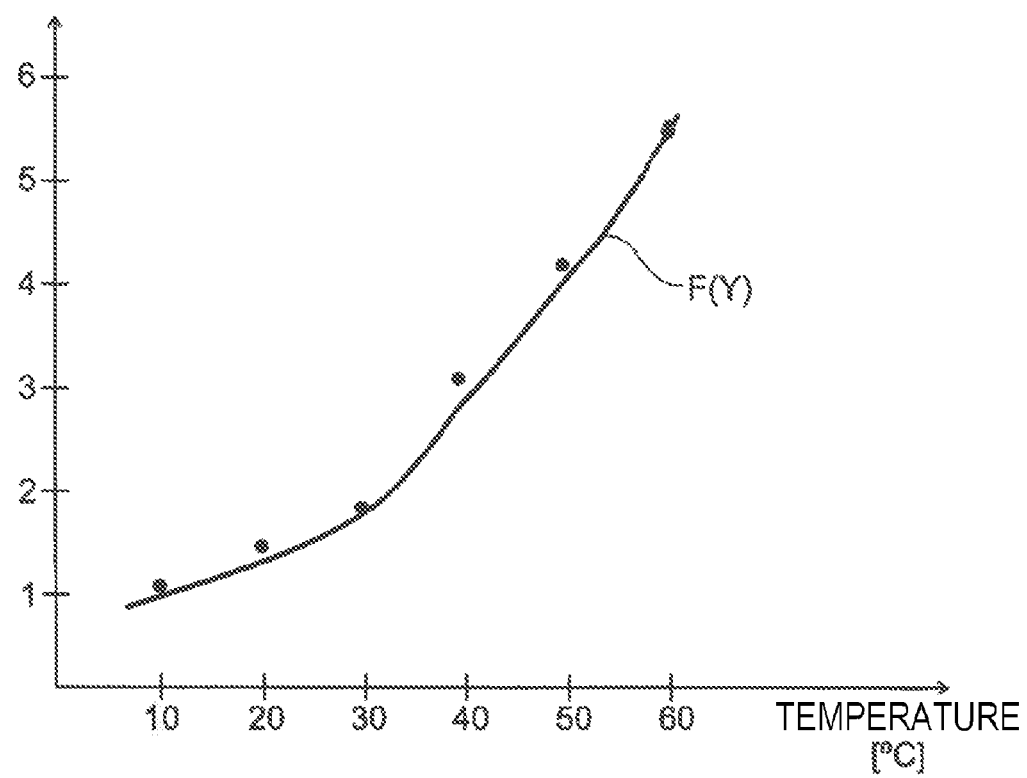
FIG. 13 shows a graphical illustration of the dependence of a coordinate of the position of a gas feed device as a function of the temperature of the gas feed device, according to an embodiment of the system described herein.

In this embodiment of the method t of the system described herein, provision may be made for carrying out method steps S2A to S5A repeatedly in such a way that a plurality of positions are determined for a plurality of different temperatures of the hollow tube 1003 and are stored in the database 126 depending on the respective temperature. To put it another way, this embodiment of the further method of the system described herein may involve determining a first position depending on a first temperature of the hollow tube 1003 and a second position depending on a second temperature of the hollow tube 1003 wherein the hollow tube 1003 both in the first position and in the second position is at the predefinable distance from the surface 2001 of the object 125. In particular, this embodiment of the method of the system described herein may provide for ascertaining a multiplicity of positions depending on respectively different temperatures of the hollow tube 1003, in which in each case the distance between the hollow tube 1003 and the surface 2001 of the object 125 corresponds to the predefinable distance. The multiplicity is, for example, more than 3 positions, more than 8 positions or more than 10 positions depending on different temperatures of the hollow tube 1003. FIG. 13 shows, for example, 6 positions determined by means of method steps S2A to S5A mentioned above. In this example, 10°, 20°, 30°, 40°, 50° and 60° were chosen as temperatures. In FIG. 13, coordinates along the y-axis for the determined positions mentioned above may be plotted as a function of the temperature of the hollow tube 1003, wherein the coordinate system having its origin at the coincidence point 2000 was selected as the coordinate system. The same may also analogously be done with the coordinates along the x-axis and the z-axis for the determined positions mentioned above. The higher the temperature of the hollow tube 1003, the greater the length extent of the hollow tube 1003 and the further away from the surface 2001 of the object 125 the hollow tube 1003 is arranged in order that the predefinable distance is achieved.

The embodiment of the method of the system described herein as illustrated in FIG. 13 may involve determining a functional relationship F(y) with respect to the coordinates of the determined positions as a function of the selected temperature of the hollow tube 1003. The functional relationship F(y) may be a linear relationship or a nonlinear relationship. A step function may also be comprised by the functional relationship F(y) or forms the functional relationship F(y). By way of example, the functional relationship F(y) may be determined by an interpolation. Any suitable interpolation method, for example, a linear interpolation, a nonlinear interpolation, a trigonometric interpolation, a logarithmic interpolation and/or a spline interpolation, may be used in the interpolation. In addition and/or as an alternative thereto, provision is made for determining the functional relationship F(y) by extrapolation. Any suitable extrapolation method, for example, a linear extrapolation, a non-linear extrapolation, a trigonometric extrapolation and/or a logarithmic extrapolation, may be used in the extrapolation. As an alternative or in addition thereto, the functional relationship F(y) may be determined by forming an average, ascertaining random values and/or determining the smallest value or the largest value from the set of the first value and the second value. The functional relationship F(y) determined is likewise stored in the database 126 of the storage unit 123. The same may also analogously be done with the coordinates along the x-axis and the z-axis for the determined positions mentioned above.

Figure 14:
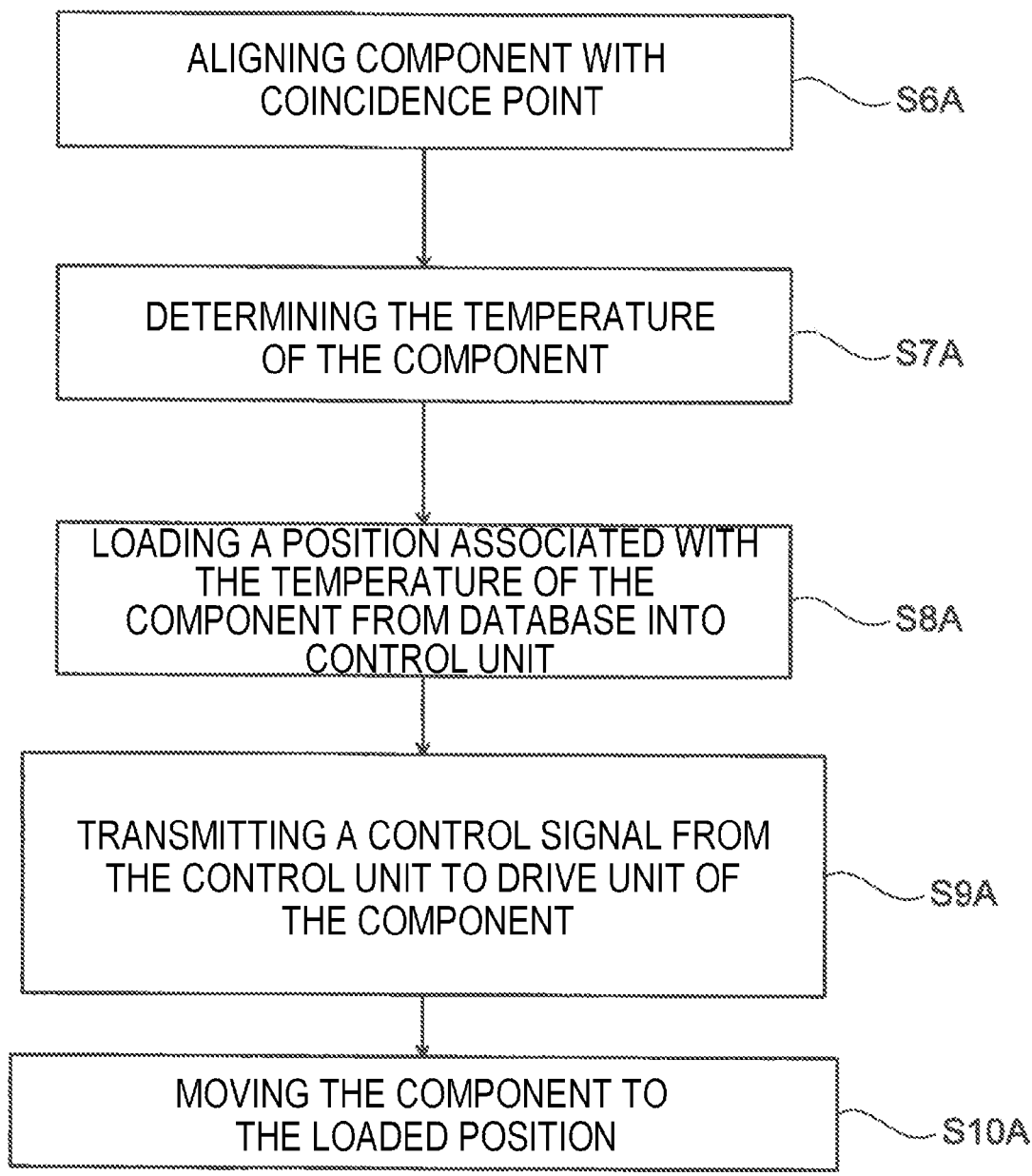
FIG. 14 shows one embodiment of the further method according to an embodiment of the system described herein.

FIG. 14 shows method steps of one embodiment of the further method of the system described herein. These method steps may be carried out, for example, by a user of the combination apparatus 200. A method step S6A may involve aligning the hollow tube 1003 with the coincidence point 2000. This is carried out, for example, as described above. A method step S7A may involve determining the temperature of the hollow tube 1003 by means of a temperature measuring unit. By way of example, an infrared measuring apparatus or a semiconductor temperature sensor is used as the temperature measuring unit. Furthermore, in a method step S8A with respect to the determined and measured temperature of the hollow tube 1003, the associated position of the hollow tube 1003 may be loaded from the database 126 into the control unit 123. This is, for example, a position which was ascertained and stored by means of method steps S1A to S5A or is determinable by means of the functional relationship. To put it another way, that position of the hollow tube 1003 which the hollow tube 1003 is intended to assume if the hollow tube 1003 has the measured temperature may be loaded from the database 126. Furthermore, the embodiment illustrated in FIG. 14 may comprise transmitting a control signal from the control unit 123 to the adjusting unit 1005, by which the hollow tube 1003 is moved (method step S9A). The control signal may have, in particular, the parameter set for the adjusting unit 1005 with which the hollow tube 1003 may be moved into the position loaded from the database 126. The embodiment of the further method of the system described herein also may comprise moving the hollow tube 1003 into the position loaded from the database 126 by means of the adjusting unit 1005 (method step S10A). When the hollow tube 1003 is arranged in the position loaded from the database 126, the hollow tube 1003 may be at the predefinable distance from the surface 2001 of the object 125. The position then assumed by the hollow tube 1003 is the processing position.

In a further embodiment of the further method according to an embodiment of the system described herein, provision may be made for carrying out all of the method steps of the embodiment from FIG. 11, wherein method step S6A is now carried out instead of method step S6. Reference is made to the explanations given above, which also apply here, mutatis mutandis.

The further method according to an embodiment of the system described herein likewise has the advantage that the hollow tube 1003 in the combination apparatus 200 always assumes the position in which the hollow tube 1003 is at a suitable distance from the object 125. By way of example, this is the smallest possible distance from the object 125. The smallest possible distance is, for example, the distance at which the hollow tube 1003 achieves the technical effect already explained above and at which the hollow tube 1003 does not disturb further processes carried out by means of the combination apparatus 200. On account of the determination of the temperature of the hollow tube 1003, a change in a length extent of the hollow tube 1003, which is dependent on the temperature of the hollow tube 1003, may be taken into account in the setting of the position of the hollow tube 1003 in such a way that the hollow tube 1003 is always at the predefinable distance from the object 125. Furthermore, the further method according to an embodiment of the system described herein provides a possibility of arranging the hollow tube 1003 in an automated manner in the position in which it is at the predefinable distance. Furthermore, the method according to an embodiment of the system described herein ensures that the hollow tube 1003 can be brought very rapidly from the parked position, which is at a distance of a few centimeters from the object 125, into the processing position, in which the hollow tube 1003 is at the predefinable distance from the object 125.

The features of the system described herein disclosed in the present description, in the drawings and in the claims may be essential for the realization of the invention in the various embodiments thereof, both individually and in arbitrary combinations. The invention is not restricted to the described embodiments. It may be varied within the scope of the claims and taking into account the knowledge of the relevant person skilled in the art.

Other embodiments of the system described herein will be apparent to those skilled in the art from a consideration of the specification and/or an attempt to put into practice the system described herein disclosed herein. It is intended that the specification and examples be considered as illustrative only, with the true scope and spirit of the invention being indicated by the following claims.

The invention claimed is:

1. A method for setting a position of a component in a particle beam apparatus, wherein the particle beam apparatus has an object arranged on an object carrier embodied in a movable fashion, wherein the component is embodied as a gas feed device, as a particle detector and/or as a beam detector, and wherein the method comprises:
    aligning the component with a coincidence point of a particle beam of the particle beam apparatus, wherein the coincidence point is the point at which the particle beam impinges on the object;
    determining a rotation angle of a rotation of the object carrier about a rotation axis;
    loading a position of the component associated with the rotation angle from a database into a control unit;
    transmitting a control signal from the control unit to a drive unit for moving the component; and
    moving the component into the position loaded from the database by means of the drive unit, wherein the component arranged in the loaded position is at a predefinable distance from the object.

2. The method as claimed in claim 1, wherein the predefinable distance is predefined by a setpoint distance; and wherein loading the position of the component associated with the rotation angle from the database is carried out depending on the setpoint distance.

3. The method as claimed in claim 1, wherein the position of the component associated with the rotation angle is determined and is stored in the database for the purpose of loading from the database into the control unit.

4. The method as claimed in claim 3, wherein the position of the component associated with the rotation angle is determined and is stored in the database for the purpose of loading from the database into the control unit as follows:
    (i) rotating the object carrier about a rotation axis with a selectable rotation angle;
    (ii) determining an actual distance between the component and the object;
    (iii) if the actual distance determined does not correspond to the predefinable distance, moving the component into a position by means of the drive unit in such a way that the component is at the predefinable distance from the object;
    (iv) storing the position assumed by the component in step (iii) in the database, and also a parameter set of the drive unit associated with the position assumed by the component in step (iii).

5. A method for setting a position of a component in a particle beam apparatus, wherein the particle beam apparatus has an object arranged on an object carrier embodied in a movable fashion, wherein the component is embodied as a gas feed device, as a particle detector and/or as a beam detector, and wherein the method comprises the following steps:
    aligning the component with a coincidence point of a particle beam of the particle beam apparatus, wherein the coincidence point is the point at which the particle beam impinges on the object;

determining a temperature of the component by means of a temperature measuring unit;

loading a position of the component associated with the temperature of the component from a database into a control unit;

transmitting a control signal from the control unit to a drive unit for moving the component; and moving the component into the position loaded from the database by means of the drive unit, wherein the component arranged in the loaded position is at a predefinable distance from the object.

6. The method as claimed in claim 5, wherein the predefinable distance is predefined by a setpoint distance; and wherein loading the position of the component associated with the temperature of the component from the database is carried out depending on the setpoint distance.

7. The method as claimed in claim 5, wherein the position of the component associated with the temperature of the component is determined and is stored in the database for the purpose of loading from the database into the control unit.

8. The method as claimed in claim 7, wherein the position associated with the temperature of the component is determined and is stored in the database for the purpose of loading from the database into the control unit as follows:

after determining the temperature of the component, determining an actual distance between the component and the object;

if the actual distance does not correspond to the predefinable distance, moving the component into a position in such a way that the component is at the predefinable distance from the object; and storing the position of the component determined in step (ii) in the database, and also a parameter set of the drive unit associated with the position of the component determined in step (ii).

9. The method as claimed in claim 1, wherein the component is moved along a straight line connecting the coincidence point to a point arranged on the surface of the component, wherein the point is arranged closest to the coincidence point.

10. The method as claimed in claim 1, wherein the component is moved from a first starting position into a second starting position by means of the drive unit, wherein the first starting position is further away from the coincidence point than the second starting position, and wherein the component is moved from the second starting position into the position loaded from the database by means of the drive unit.

11. A non-transitory computer readable medium containing software which is loadable into a processor and which, when executed, controls a particle beam apparatus and/or a component of the particle beam apparatus, wherein the particle beam apparatus has an object arranged on an object carrier embodied in a movable fashion, and wherein the component is embodied as a gas feed device, as a particle detector and/or as a beam detector, software comprising:

executable code that aligns the component with a coincidence point of a particle beam of the particle beam apparatus, wherein the coincidence point is the point at which the particle beam impinges on the object;

executable code that determines a rotation angle of a rotation of the object carrier about a rotation axis;

executable code that loads a position of the component associated with the rotational angle from a database into a control unit;

executable code that transmits a control signal from the control unit to a drive unit for moving the component; and executable code that moves the component into the position loaded from the database by means of the drive unit, wherein the component arranged in the loaded position is at a predefinable distance from the object.

12. A particle beam apparatus for imaging, analyzing and/or processing an object, comprising:

at least one beam generator for generating a particle beam with charged particles;

at least one objective lens for focusing the particle beam onto the object;

at least one object carrier for arranging the object; and at least one sample chamber in which a component of the particle beam apparatus is arranged, wherein the component is embodied as a gas feed device, as a particle detector and/or as a beam detector, wherein the object carrier and/or the component are/is embodied in an adjustable fashion, and wherein the particle beam apparatus further comprises at least one processor coupled to a non-transitory computer readable medium containing software which is loadable into the at least one processor, the software comprising:

executable code that aligns the component with a coincidence point of the particle beam of the particle beam apparatus, wherein the coincidence point is the point at which the particle beam impinges on the object;

executable code that determines a rotation angle of a rotation of the object carrier about a rotation axis;

executable code that loads a position of the component associated with the rotational angle from a database into a control unit;

executable code that transmits a control signal from the control unit to a drive unit for moving the component; and executable code that moves the component into the position loaded from the database by means of the drive unit, wherein the component arranged in the loaded position is at a predefinable distance from the object.

13. The particle beam apparatus as claimed in claim 12, wherein the object carrier is embodied as movable along at least one of the following axes, namely a first axis, a second axis and a third axis, and wherein at least two of the aforementioned axes are oriented perpendicular to one another.

14. The particle beam apparatus as claimed in claim 12, wherein the object carrier is embodied as rotatable about a first rotation axis and/or about a second rotation axis.

15. The particle beam apparatus as claimed in claim 12, wherein the component is embodied as movable along at least one of the following axes, namely a first component axis, a second component axis and a third component axis, and wherein at least two of the aforementioned axes are oriented perpendicular to one another.

16. The particle beam apparatus as claimed in claim 12, wherein the component is embodied as rotatable about a first component rotation axis and/or about a second component rotation axis.

17. The particle beam apparatus as claimed in claim 12, wherein the beam generator is embodied as a first beam generator, wherein the particle beam is embodied as a first particle beam with first charged particles, wherein the objective lens is embodied as a first objective lens for focusing the first particle beam onto the object, and wherein the particle beam apparatus furthermore comprises:

at least one second beam generator for generating a second particle beam with second charged particles; and at least one second objective lens for focusing the second particle beam onto the object.

18. The particle beam apparatus as claimed in claim 12, wherein the particle beam apparatus is an electron beam apparatus and/or an ion beam apparatus.

\* \* \* \* \*